(12) United States Patent
Ooshima et al.

(10) Patent No.: US 12,609,216 B2
(45) Date of Patent: Apr. 21, 2026

(54) MULTI-CORE CABLE, AND DISCONNECTION DETECTION DEVICE

(71) Applicants:SUMITOMO ELECTRIC INDUSTRIES, LTD., Osaka (JP); Sumitomo Wiring Systems, Ltd., Mie (JP); AutoNetworks Technologies, Ltd., Mie (JP)

(72) Inventors: Takumi Ooshima, Tochigi (JP); Soichiro Okumura, Osaka (JP); Hirokazu Komori, Osaka (JP); Takahiro Murata, Mie (JP)

(73) Assignees: SUMITOMO ELECTRIC INDUSTRIES, LTD., Osaka (JP); Sumitomo Wiring Systems, Ltd., Mie (JP); AutoNetworks Technologies, Ltd., Mie (JP)

( * ) Notice: Subject to any disclaimer, the term of this patent is extended or adjusted under 35 U.S.C. 154(b) by 148 days.

(21) Appl. No.: 18/699,418

(22) PCT Filed: Oct. 19, 2021

(86) PCT No.: PCT/JP2021/038674
§ 371 (c)(1),
(2) Date: Apr. 8, 2024

(87) PCT Pub. No.: WO2023/067713
PCT Pub. Date: Apr. 27, 2023

(65) Prior Publication Data
US 2024/0412894 A1 Dec. 12, 2024

(51) Int. Cl.
G01R 27/28 (2006.01)
G01R 27/26 (2006.01)
(Continued)

(52) U.S. Cl.
CPC ............ H01B 7/0009 (2013.01); G01R 27/26 (2013.01); G01R 31/54 (2020.01); H01B 7/18 (2013.01); H01B 11/02 (2013.01); B60R 16/03 (2013.01)

(58) Field of Classification Search
CPC ...... G01R 31/54; G01R 27/26; H01B 7/0009; H01B 7/18; H01B 7/32; H01B 11/02; H01B 9/003
See application file for complete search history.

(56) References Cited

U.S. PATENT DOCUMENTS

| | | | |
|---|---|---|---|
| 6,011,399 A | 1/2000 | Matsumaru et al. | |
| 2008/0007878 A1* | 1/2008 | Gandolfi | H02H 3/14 361/42 |

(Continued)

FOREIGN PATENT DOCUMENTS

| | | |
|---|---|---|
| JP | S61-224212 | 10/1986 |
| JP | S63-077219 U | 5/1988 |

(Continued)

*Primary Examiner* — Thang X Le
(74) *Attorney, Agent, or Firm* — IPUSA, PLLC

(57) ABSTRACT

A multicore cable includes a plurality of coated electric wires; a detection wire; and a sheath. The coated electric wires include an electric wire conductor and an electric wire coating. The electric wire conductor is a stranded wire of a plurality of electric wire filaments, and the electric wire coating covers an outer surface of the electric wire conductor. The detection wire includes a detection wire conductor that is a stranded wire of a plurality of detection wire filaments. The sheath covers an outer surface of a core that includes the coated electric wires and the detection wire. The coated electric wires include two electric power supply wires disposed so as to be next to each other, and the detection wire is disposed in a region enclosed by: the two electric power supply wires disposed so as to be next to each other; and the sheath.

18 Claims, 10 Drawing Sheets

(51) Int. Cl.
    *G01R 31/54*         (2020.01)
    *H01B 7/00*          (2006.01)
    *H01B 7/18*          (2006.01)
    *H01B 11/02*       (2006.01)
    *B60R 16/03*       (2006.01)

(56)             References Cited

U.S. PATENT DOCUMENTS

| | | | |
|---|---|---|---|
| 2017/0110223 A1* | 4/2017 | Wu ........................ | H01B 11/20 |
| 2018/0005723 A1* | 1/2018 | Kohori ..................... | H01B 3/30 |
| 2018/0281706 A1* | 10/2018 | Kobayashi .......... | B60R 16/0215 |
| 2019/0077341 A1* | 3/2019 | Kohori ................... | H01B 1/026 |
| 2019/0172606 A1 | 6/2019 | Kohori | |
| 2020/0066425 A1* | 2/2020 | Kobayashi ............. | H01B 9/003 |
| 2021/0024018 A1* | 1/2021 | Kobayashi ............ | B60R 16/023 |

FOREIGN PATENT DOCUMENTS

| | | |
|---|---|---|
| JP | H09-189740 | 7/1997 |
| JP | H09-306248 | 11/1997 |
| JP | 2000-028669 | 1/2000 |
| JP | 2005-166450 | 6/2005 |
| JP | 2015-138751 | 7/2015 |
| JP | 2019-102268 | 6/2019 |

* cited by examiner 30          30A

32

31

300

321

31

322

MULTI-CORE CABLE, AND DISCONNECTION DETECTION DEVICE

TECHNICAL FIELD

The present disclosure relates to multicore cables and disconnection detectors.

BACKGROUND ART

Patent Literature 1 discloses a cable for an electric brake including: at least one electric power supply wire configured to supply electric power to a motor serving as a braking source for an electric brake of a vehicle, such as an automobile; and at least one signaling wire configured to transmit a signal related to control of the motor. The disclosed cable includes at least one disconnection detection wire that is vertically attached to the electric power supply wire and the signaling wire or is helically wound around these wires and combined therewith. The disconnection detection wire is formed to be disconnected before disconnection of the electric power supply wire or the signaling wire. The disconnection detection wire is covered with an insulating coating.

CITATION LIST

Patent Literature

Patent Literature 1: Japanese Patent Publication No. 2005-166450

SUMMARY OF THE INVENTION

A multicore cable of the present disclosure includes a plurality of coated electric wires; a detection wire; and a sheath. The coated electric wires include an electric wire conductor and an electric wire coating. The electric wire conductor is a stranded wire of a plurality of electric wire filaments. The electric wire coating covers an outer surface of the electric wire conductor. The detection wire includes a detection wire conductor that is a stranded wire of a plurality of detection wire filaments. The sheath covers an outer surface of a core that includes the coated electric wires and the detection wire. The coated electric wires include two electric power supply wires disposed so as to be next to each other. The detection wire is disposed in a region enclosed by: the two electric power supply wires disposed so as to be next to each other; and the sheath.

DESCRIPTION OF THE EMBODIMENTS

Figure 1A:
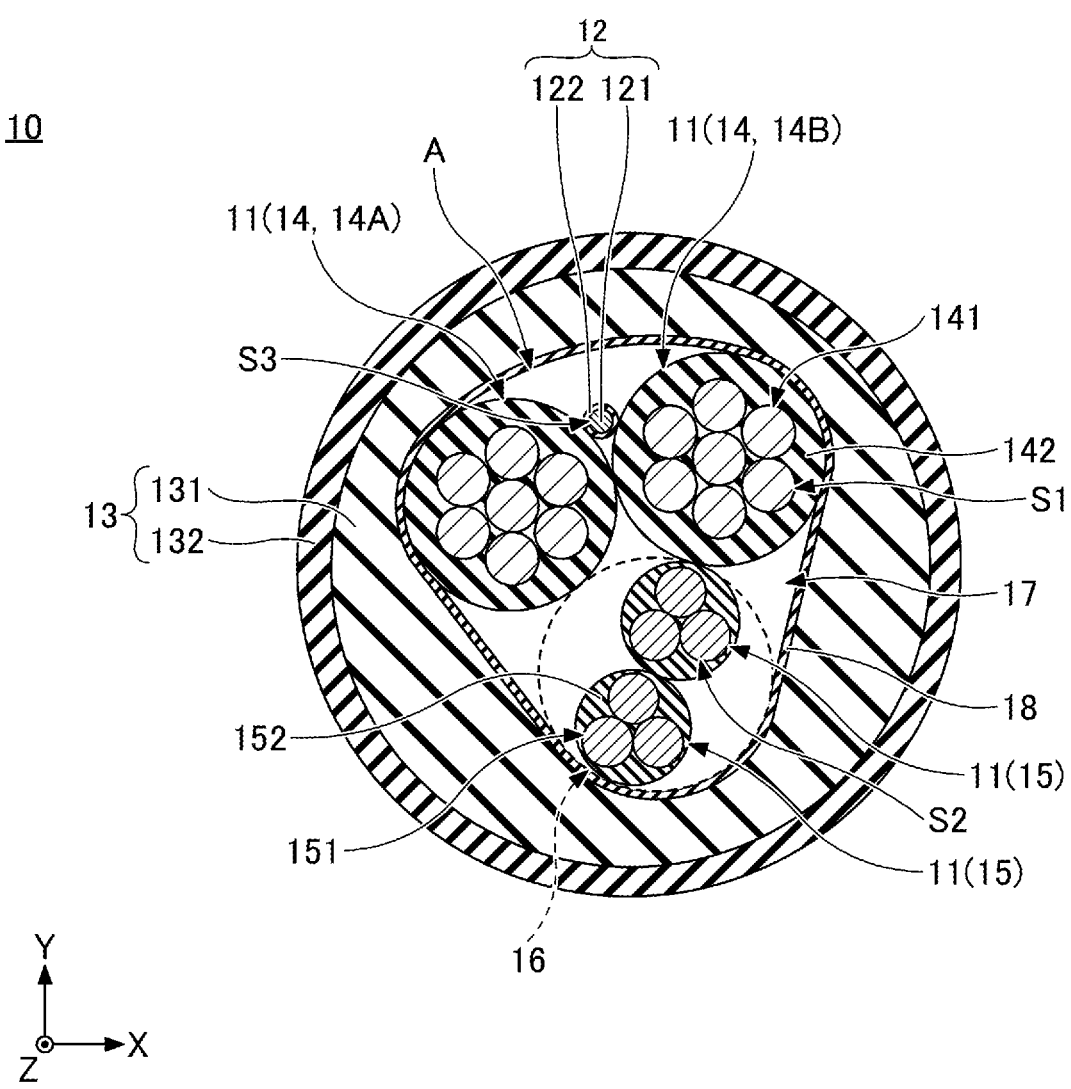
FIG. 1A is a cross-sectional view of a multicore cable according to one aspect of the present disclosure in a plane perpendicular to a longitudinal direction of the multicore cable.

Objects to be Solved by the Present Disclosure

As disclosed in Patent Literature 1, a cable, which often undergoes a bending motion, is provided with a disconnection detection wire configured to predict disconnection of an electric wire included in the cable.

In a cross section perpendicular to the longitudinal direction of a multicore cable including a plurality of coated electric wires, the included coated electric wires are not disposed in point symmetry with the center of the cross section as a point of symmetry. Thus, prediction of the magnitude of a load is challenging, for example, when the coated electric wires having different configurations are disposed along the circumferential direction. Therefore, in the multicore cable having the above configuration, prediction of disconnection of the coated electric wires is sometimes impossible.

It is an object of the present disclosure to provide a multicore cable in which disconnection of the electric power supply wires can be predicted.

Effects of the Present Disclosure

According to the present disclosure, it is possible to provide a multicore cable in which disconnection of the electric power supply wires can be predicted.

Embodiments will be described below.

DESCRIPTION OF EMBODIMENTS OF THE PRESENT DISCLOSURE

First, embodiments of the present disclosure will be listed and described. In the following description, the same or corresponding elements are provided with the same symbols, and the same description thereof is not repeated.

(1) A multicore cable according to one aspect of the present disclosure includes a plurality of coated electric wires; a detection wire; and a sheath, in which the coated electric wires include an electric wire conductor and an electric wire coating, the electric wire conductor being a stranded wire of a plurality of electric wire filaments, and the electric wire coating covering an outer surface of the electric wire conductor, the detection wire includes a detection wire conductor that is a stranded wire of a plurality of detection wire filaments, the sheath covers an outer surface of a core that includes the coated electric wires and the detection wire, the coated electric wires include two electric power supply wires disposed so as to be next to each other, and the detection wire is disposed in a region enclosed by: the two electric power supply wires disposed so as to be next to each other; and the sheath.

In the multicore cable including a plurality of coated electric wires according to one aspect of the present disclosure, the detection wire is disposed in a region enclosed by: the two electric power supply wires disposed so as to be next to each other; and the sheath. Therefore, even if, in a cross section perpendicular to the longitudinal direction of a multicore cable, coated electric wires having different configurations are disposed along the circumferential direction and the coated electric wires are not disposed in point symmetry with the center of the cross section as a point of symmetry, an approximately equal quantity of load is applied to both the detection wire and the electric power supply wires when the multicore cable is repeatedly bent. Moreover, by disposing the detection wire in the region enclosed by: the two electric power supply wires disposed so as to be next to each other; and the sheath, the position of the detection wire in the core becomes stable even if the multicore cable is repeatedly bent. Therefore, by measuring electrical characteristics of the detection wire conductor included in the detection wire and evaluating the state of the detection wire conductor, disconnection of the electric power supply wire can be predicted at an appropriate timing.

(2) A filament diameter of the detection wire filaments may be equal to a filament diameter of the electric wire filaments included in the electric power supply wires.

According to the multicore cable according to one aspect of the present disclosure, an approximately equal quantity of load can be applied to both the detection wire and the electric power supply wires when the multicore cable is repeatedly bent. Therefore, when the filament diameter of the detection wire filaments included in the detection wire is equal to the filament diameter of the electric wire filaments included in the electric power supply wires, disconnection of the electric power supply wire can be predicted at an appropriate timing.

(3) A filament diameter of the detection wire filaments may be greater than a filament diameter of the electric wire filaments included in the electric power supply wires.

In this configuration, the filament diameter of the detection wire filaments included in the detection wire is greater than the filament diameter of the electric wire filaments included in the electric power supply wires. With this configuration, the detection wire is more likely to be disconnected than is the electric power supply wire when the multicore cable is repeatedly bent. Therefore, disconnection of the electric power supply wire can be predicted at an early stage with high accuracy.

(4) The detection wire may be a coaxial cable including: a detection wire coating covering an outer surface of the detection wire conductor; and a shield conductor covering an outer surface of the detection wire coating.

When measuring characteristic impedance between two conductors, for example, a measurement device is connected between the detection wire conductor of the detection wire, and the shield conductor. When the position of the detection wire conductor of the detection wire and the position of the shield conductor are constant and no other coated electric wire is placed therebetween, noise in measuring characteristic impedance can be suppressed and measurement can be performed stably.

(5) The electric power supply wire may include a first stranded wire obtained by twisting the electric wire filaments together and a second stranded wire obtained by twisting a plurality of first stranded wires together, and a pitch of twisting of the detection wire conductor may be longer than a pitch of twisting of the first stranded wire.

When the pitch of twisting of the detection wire conductor is longer than the pitch of twisting of the first stranded wires included in the electric power supply wire, the detection wire is more likely to be disconnected than is the electric power supply wire. Therefore, by measuring the electrical characteristics of the detection wire conductor included in the detection wire and evaluating the state of the detection wire conductor, it is possible to predict disconnection of the electric power supply wire at an early stage with high accuracy, the electric power supply wire having an especially high demand for prediction of disconnection among the coated electric wires included in the multicore cable.

(6) The coated electric wires may include a communication wire, and a relation of $S1>S2>S3$ is satisfied, where $S1$ denotes a conductor cross-sectional area of the electric wire conductor included in the electric power supply wire, $S2$ denotes a conductor cross-sectional area of the electric wire conductor included in the communication wire, and $S3$ denotes a conductor cross-sectional area of the detection wire conductor.

When the above relation is satisfied by the conductor cross-sectional area $S1$ of the electric wire conductor included in the electric power supply wire, the conductor cross-sectional area $S2$ of the electric wire conductor included in the communication wire, and the conductor cross-sectional area $S3$ of the detection wire conductor, the detection wire can be appropriately disposed in the region enclosed by: the two electric power supply wires disposed so as to be next to each other; and the sheath.

(7) The coated electric wires may include two communication wires, the two communication wires may be twisted together to form a twisted pair communication wire, the twisted pair communication wire may be disposed in a region enclosed by: the two electric power supply wires disposed so as to be next to each other; and the sheath, and in a cross section perpendicular to a longitudinal direction of the core, the region in which the detection wire is disposed and the region in which the twisted pair communication wire is disposed may be disposed so as to sandwich the two electric power supply wires disposed so as to be next to each other.

By disposing the detection wire and the twisted pair communication wire in the above-described manner, interference between signals from the detection wire and the twisted pair communication wire is suppressed, and more accurate signals can be transmitted.

(8) The core may be formed by twisting the coated electric wires and the detection wire together, and in the core, the detection wire and a first electric power supply wire of the electric power supply wires may be disposed so as to contact each other and may be twisted together, the first electric power supply wire being connected to a ground potential.

When the detection wire and the first electric power supply wire connected to the ground potential are twisted together in contact with each other, noise in measuring characteristic impedance can be suppressed, and measurement of characteristic impedance can be performed readily and stably.

(9) A shield layer covering the outer surface of the core may be included, and the shield layer may be disposed between the core and the sheath.

In a cross section perpendicular to the longitudinal direction of the multicore cable, the shield layer is disposed outward of the coated electric wires and the detection wire. Therefore, when the multicore cable suddenly receives an impact by the action of an external force or when the multicore cable receives contact or friction with respect to an external object, the shield layer is more likely to receive a large quantity of load, and then break, than do the coated electric wires and the detection wire. Therefore, by disposing the shield layer and detecting damage and breakage of the shield layer, it is possible to detect that a sign indicating potential damage caused by an impact or external damage is occurring in the coated electric wires with high sensitivity. As a result, accuracy in prediction of disconnection of the coated electric wires is increased.

(10) A drain wire may be included, the shield layer may have a stacked structure of: a conductive layer disposed to face the core; and a substrate including an insulating material, and the drain wire may be in contact with the conductive layer.

In order to evaluate whether or not the shield layer breaks, it is necessary to electrically connect the shield layer to an external measurement device. When the shield layer is formed of conductive tape or the like, it may be challenging to directly connect the shield layer to a terminal. For this reason, by providing the drain wire and keeping the drain wire in contact with the shield layer, such as a conductive layer or the like, the shield layer can be readily connected to the terminal via the drain wire.

(11) A drain wire may be included, the shield layer may have a stacked structure of: a substrate disposed to face the core and including an insulating material; and a conductive layer, and the drain wire may be in contact with the substrate including the insulating material.

When the shield layer is wound in contact with the drain wire, noise in measuring characteristic impedance can be suppressed, and measurement of characteristic impedance can be performed readily and stably.

(12) A filler may be disposed in a region enclosed by the sheath.

When the multicore cable includes the filler in the region enclosed by the sheath, it is possible to prevent displacement of the detection wire upon bending of the multicore cable, and displacement of the detection wire over time. Further, it is possible to increase accuracy of the detection wire in prediction of disconnection of the coated electric wires.

(13) The filler may be disposed so as to contact the detection wire and the electric power supply wires.

When the filler is disposed so as to contact the detection wire and the electric power supply wires as described above, it is possible to prevent displacement of the detection wire upon bending of the multicore cable, and displacement of the detection wire over time. Further, it is possible to increase accuracy of the detection wire in prediction of disconnection of the coated electric wires.

(14) A disconnection detector according to one aspect of the present disclosure includes: the multicore cable as described in any one of (1) to (13); and a measurement device configured to input an inspection signal including an AC component to the detection wire conductor, and measure characteristic impedance.

According to the disconnection detector according to one aspect of the present disclosure, the above-described multicore cable is used, and thus disconnection of the electric power supply wire can be predicted with high accuracy by measuring electrical characteristics, such as characteristic impedance, of the detection wire conductor included in the detection wire.

DETAILS OF EMBODIMENTS OF THE PRESENT DISCLOSURE

Specific examples of the multicore cable and the disconnection detector according to one embodiment of the present disclosure (hereinafter referred to as "present embodiment") will be described below with reference to the drawings. The present invention is not limited to these examples, but is intended to be presented by claims and to include all changes within the meaning and scope of equivalents of the claims.

(1) Regarding Members Included in the Multicore Cable

First, the multicore cable of the present embodiment will be described with reference to FIG. 1A to FIG. 6B.

Figure 1B:
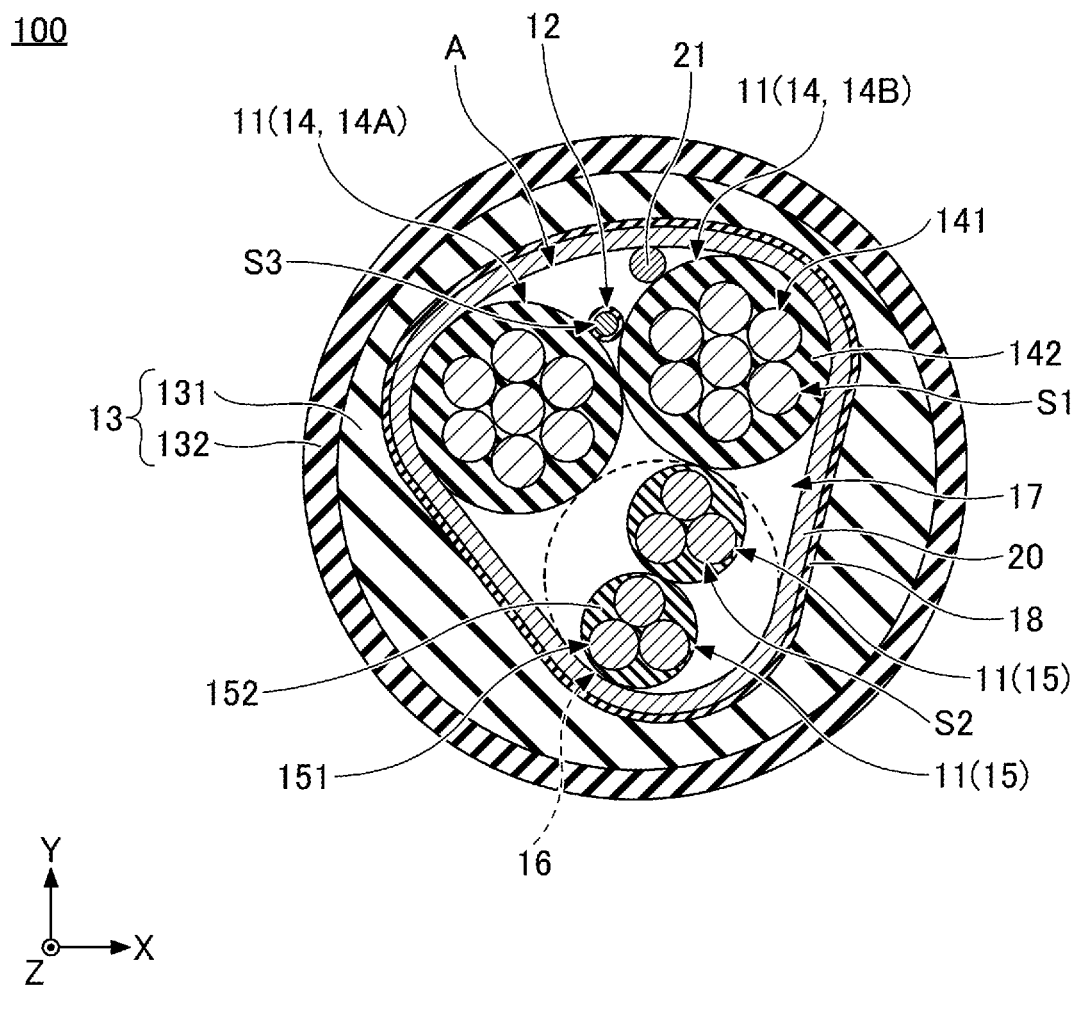
FIG. 1B is a cross-sectional view of a multicore cable according to one aspect of the present disclosure in a plane perpendicular to a longitudinal direction of the multicore cable.
Figure 1C:
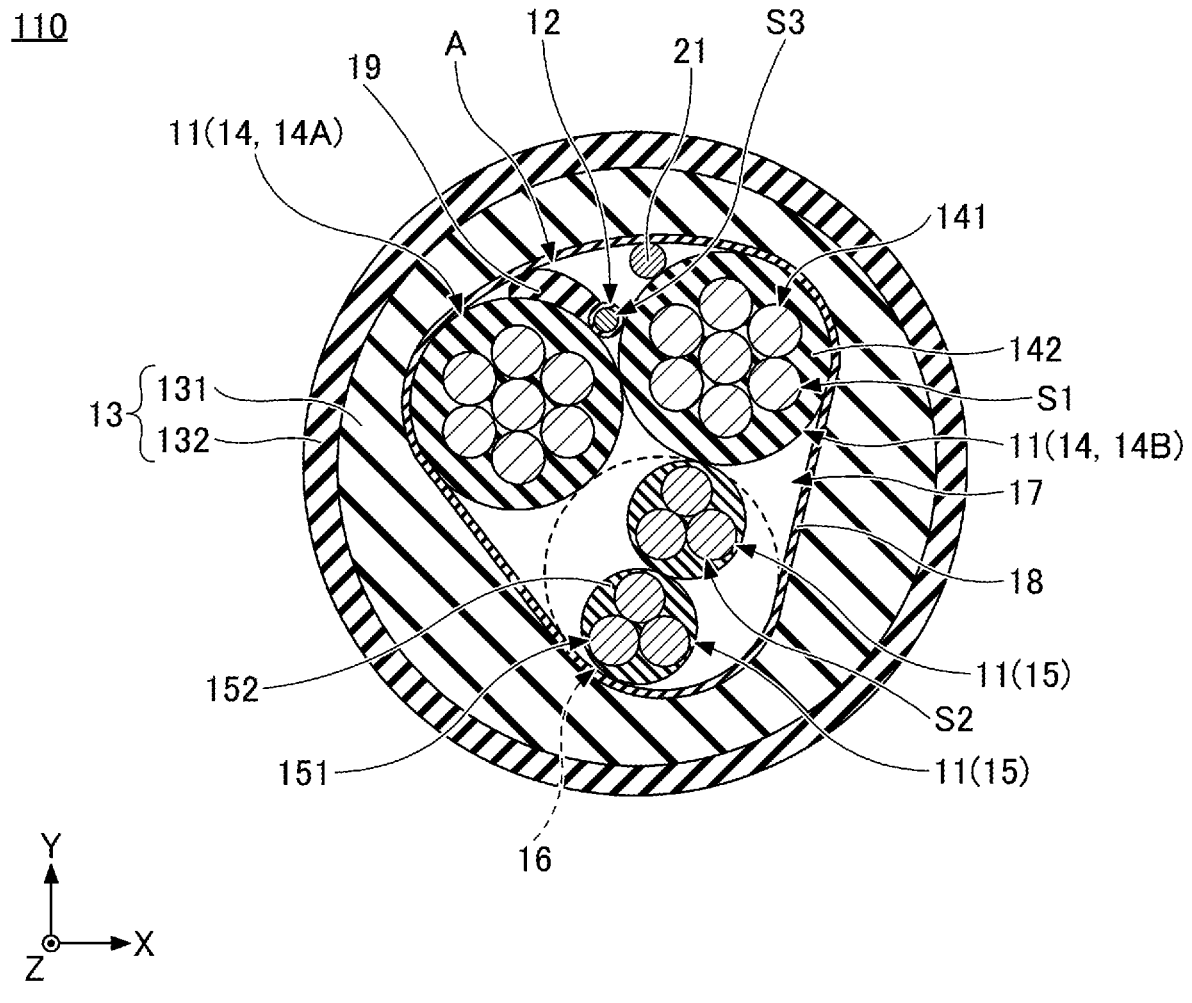
FIG. 1C is a cross-sectional view of a multicore cable according to one aspect of the present disclosure in a plane perpendicular to a longitudinal direction of the multicore cable.
Figure 1D:
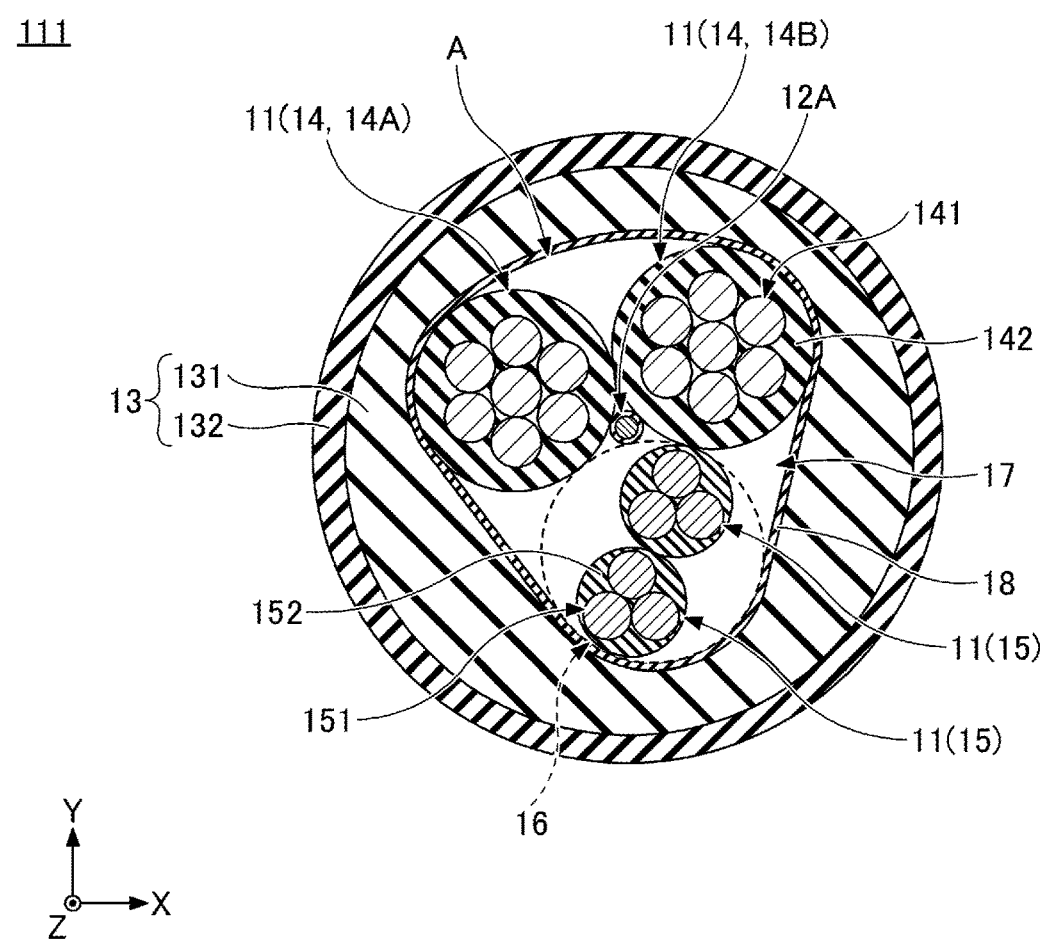
FIG. 1D is a cross-sectional view of a multicore cable used in simulation of a bending endurance test in a plane perpendicular to a longitudinal direction of the multicore cable.
Figure 2:
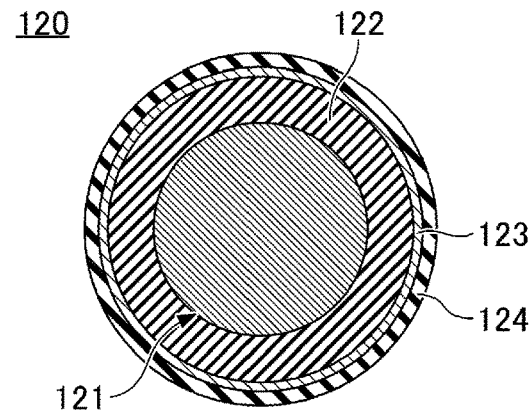
FIG. 2 is a cross-sectional view of a detection wire included in a multicore cable according to one aspect of the present disclosure in a plane perpendicular to a longitudinal direction of the detection wire.
Figure 3A:
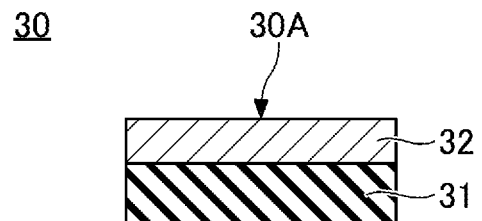
FIG. 3A is an explanatory view of a structure of conductive tape.
Figure 3B:
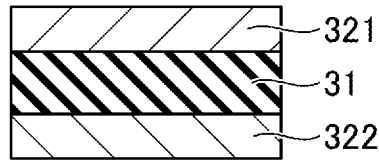
FIG. 3B is an explanatory view of a structure of conductive tape.
Figure 4:
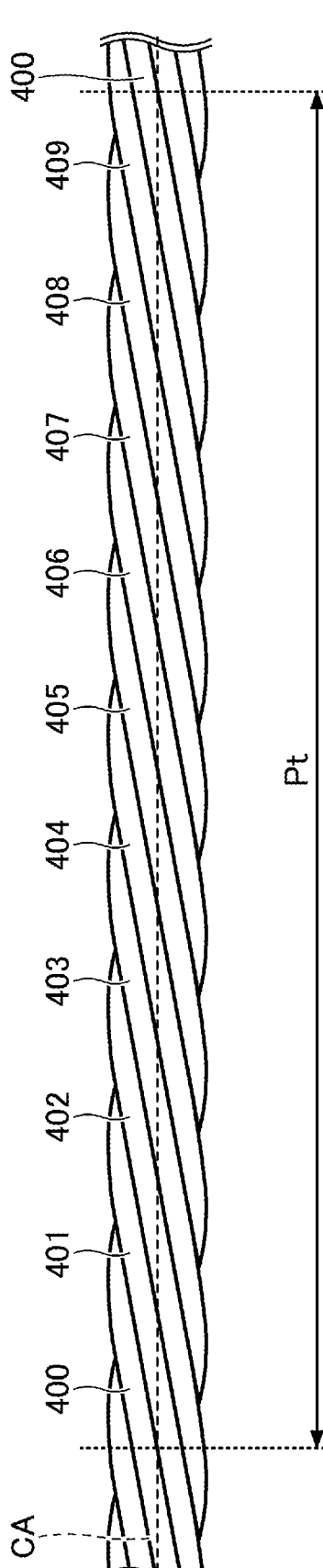
FIG. 4 is an explanatory view of a pitch of twisting.
Figure 5:
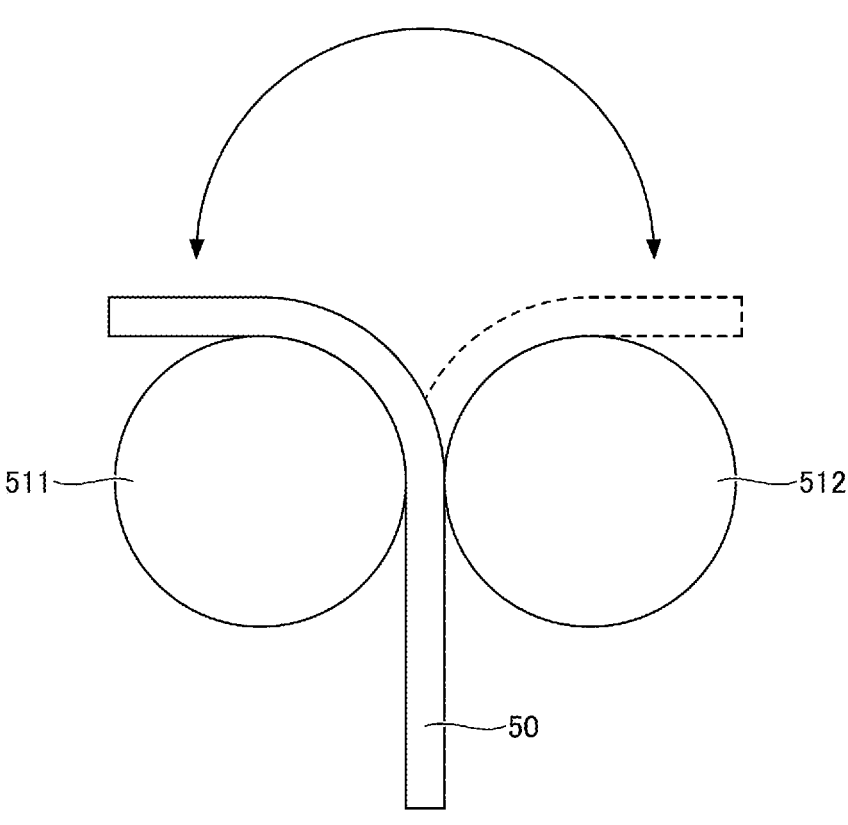
FIG. 5 is an explanatory view of the bending endurance test.
Figure 6A:
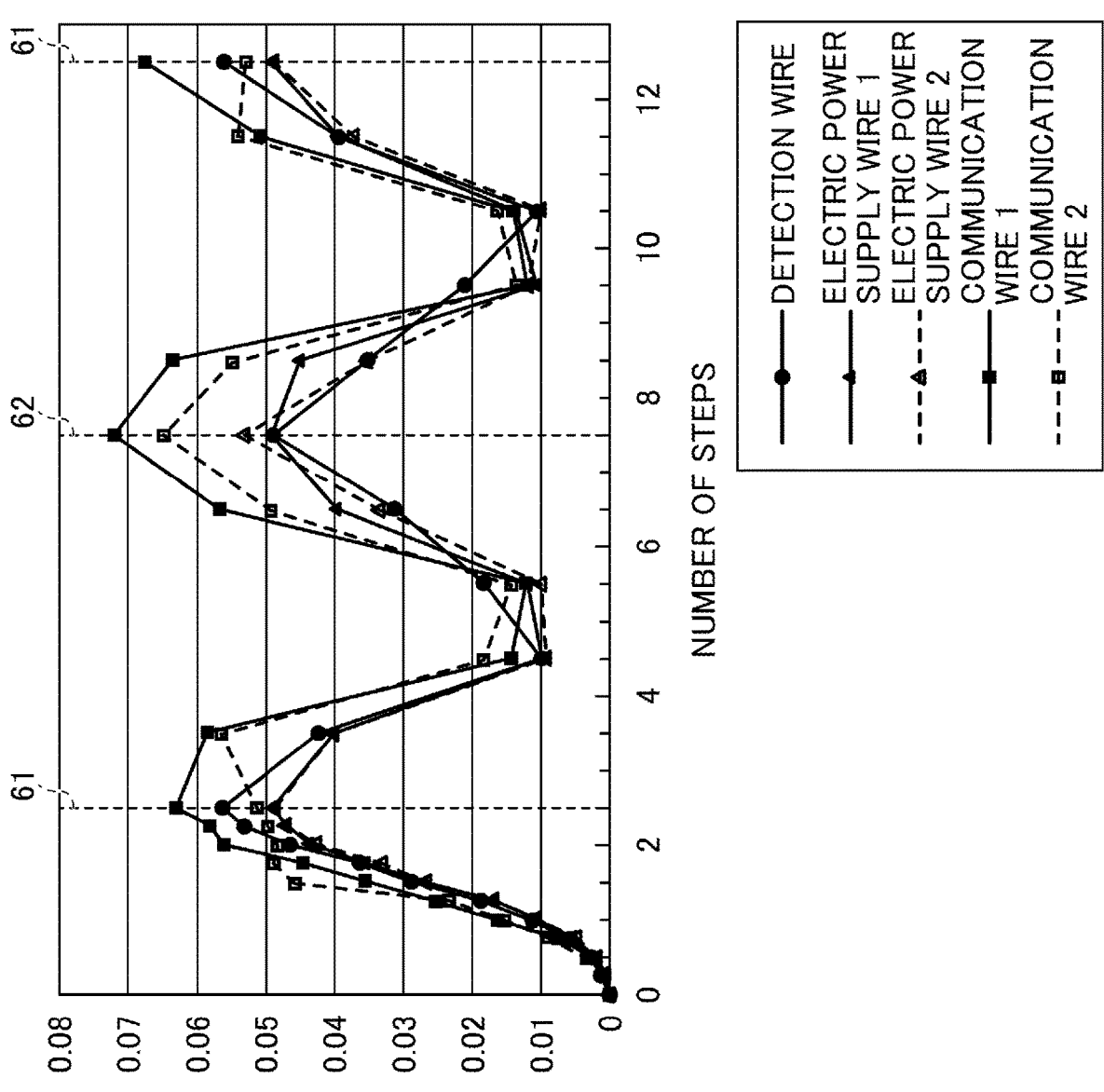
FIG. 6A is a simulation result of the bending endurance test.
Figure 6B:
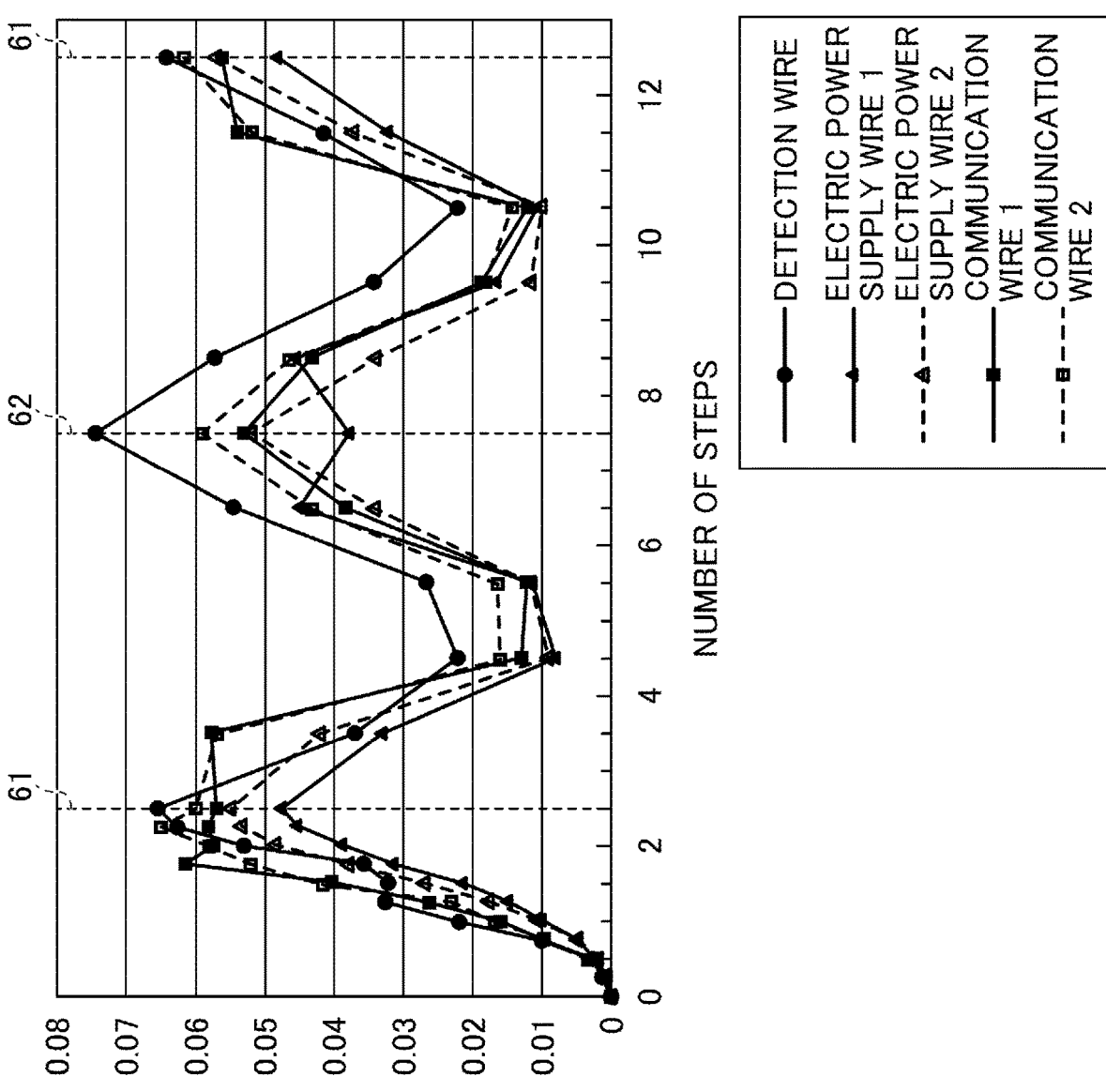
FIG. 6B is a simulation result of the bending endurance test.

FIG. 1A is a cross-sectional view of a multicore cable 10 of the present embodiment in a plane perpendicular to a longitudinal direction of the multicore cable 10. FIG. 1B is a cross-sectional view of a multicore cable 100 of the present embodiment in a plane perpendicular to a longitudinal direction of the multicore cable 100. FIG. 1C is a cross-sectional view of a multicore cable 110 of the present embodiment in a plane perpendicular to a longitudinal direction of the multicore cable 110. FIG. 1D is a cross-sectional view of a multicore cable 111 used in simulation of a bending endurance test in a plane perpendicular to a longitudinal direction of the multicore cable 111. FIG. 2 is a cross-sectional view of a detection wire 120 in a plane perpendicular to a longitudinal direction of the detection wire. FIG. 3A and FIG. 3B are explanatory views of a structure of conductive tape. FIG. 4 is an explanatory view of a pitch of twisting. FIG. 5 is an explanatory view of the bending endurance test, and FIG. 6A and FIG. 6B are simulation results of the bending endurance test.

As illustrated in FIG. 1A, the multicore cable 10 of the present embodiment includes a plurality of coated electric wires 11, a detection wire 12, and a sheath 13. In FIG. 1A to FIG. 1D, a Z-axis direction perpendicular to front surfaces of the drawings corresponds to the longitudinal directions of the multicore cable, the coated electric wires 11, the detection wire 12, a core 17, and the like. An XY plane formed by an X axis and a Y axis is a plane perpendicular to the longitudinal directions of the multicore cable 10 and the like.

Although the multicore cable 10 as illustrated in FIG. 1A includes two electric power supply wires 14 and two communication wires 15 as the coated electric wires 11, the configuration of the coated electric wires included in the multicore cable of the present embodiment is not limited to this configuration. For example, three or more electric power supply wires and three or more communication wires may be included. Also, coated electric wires other than the electric power supply wires and the communication wires may be included. The multicore cable of the present embodiment may include a given number of coated electric wires having a given configuration in accordance with, for example, a device to which the multicore cable is connected. As is clear from FIG. 1A, in the cross section perpendicular to the longitudinal direction, the coated electric wires included in the multicore cable 10 are not disposed in point symmetry with the center of the cross section as a point of symmetry, the coated electric wires having different configurations are disposed along the circumferential direction. Therefore, the center of bending of the multicore cable 10 does not coincide with the center of the cross section.

Hereinafter, the members included in the multicore cable 10 of the present embodiment will be described.

(1-1) Coated Electric Wire

The coated electric wire 11 is configured to perform functions required in apparatuses and the like, such as power supply, voltage application, communication, and the like. The coated electric wire 11 is an electric wire that is an object to be detected for a sign indicating potential damage. As described above, no particular limitation is imposed on the number and configuration of the coated electric wires 11. However, as illustrated in FIG. 1A, for example, a plurality of types of coated electric wires having different configurations can be included.

The coated electric wire 11 may include: a wire conductor that is a stranded wire of a plurality of electric wire filaments; and a wire coating that covers the outer surface of the wire conductor.

The electric power supply wire 14 includes: an electric wire conductor 141 that is a stranded wire of electric wire filaments; and a wire coating 142 that covers the outer surface of the electric wire conductor 141.

The multicore cable 10 of the present embodiment may include two or more electric power supply wires 14 as coated electric wires 11. For example, the two electric power supply wires 14 may be disposed so as to be next to each other as illustrated in FIG. 1A. Although the two electric power supply wires 14 may be disposed so as to contact each other as illustrated in FIG. 1A, a gap may be provided therebetween and a filler, which will be described below, may be provided therebetween.

As described above, there is no limitation on the configuration of the coated electric wire 11 included in the multicore cable of the present embodiment. The multicore cable of the present embodiment may include an electric power supply wire 14 in addition to the two electric power supply wires 14 disposed so as to be next to each other as illustrated in FIG. 1A and the like.

The communication wire 15 includes: an electric wire conductor 151 that is a stranded wire of electric wire filaments; and an electric wire coating 152 that covers the outer surface of the electric wire conductor 151. The communication wire 15 is of a twisted pair communication wire 16 in which two communication wires 15 are twisted together along the longitudinal direction that is the Z-axis direction perpendicular to the front surface of FIG. 1A. In FIG. 1A, the outer periphery of the twisted pair communication wire 16 is shown as a dashed line.

The filament diameter and number of the electric wire filaments constituting the electric wire conductor of the coated electric wire 11 may be selected in accordance with electrical characteristics required for the coated electric wire 11.

For example, when the coated electric wire 11 is the electric power supply wire 14, the filament diameter of the electric wire filaments thereof is preferably 0.05 mm or more and 0.16 mm or less and more preferably 0.05 mm or more and 0.10 mm or less. The electric power supply wire 14 may be the electric wire conductor 141 that is formed by twisting the electric wire filaments together in multiple steps. Therefore, for example, the electric wire conductor 141 of the electric power supply wire 14 may include: a first stranded wire (thin stranded wire) formed by twisting the electric wire filaments together; and a second stranded wire (thick stranded wire) formed by twisting a plurality of first stranded wires together. The second stranded wire may be the electric wire conductor 141. Moreover, for example, a third stranded wire formed by twisting a plurality of second stranded wires together may be the electric wire conductor 141.

The following configuration example can be given as an example of the electric wire conductor 141 of the electric power supply wire 14. Note that the electric wire conductor 141 of the electric power supply wire 14 should not be construed as being limited to the following example, which is merely illustrative.

The filament diameter of the electric wire filaments is 0.08 mm. The first stranded wire (right-hand twisted, 10 mm pitch) can be formed by twisting 48 electric wire filaments together and the second stranded wire (right-hand twisted, 30 mm pitch) can be formed by twisting seven first stranded wires together. The pitch in the 10 mm pitch or the 30 mm pitch means a pitch of twisting. As illustrated in FIG. 1A, the second stranded wire formed by twisting seven first stranded wires together may be the electric wire conductor 141. At this time, the conductor cross-sectional area S1 of the electric power supply wire 14 is 1.69 $mm^2$. The outer diameter of the electric power supply wire 14 including the electric wire coating 142 is 2.7 mm.

When the coated electric wire 11 is the communication wire 15, the filament diameter of the electric wire filaments is preferably 0.05 mm or more and 0.16 mm or less and more preferably 0.05 mm or more and 0.10 mm or less.

The communication wire 15 may be an electric wire conductor 151 that is formed by twisting the electric wire filaments together in multiple steps. That is, the electric wire conductor 151 of the communication wire 15 may include: a first stranded wire (thin stranded wire) formed by twisting the electric wire filaments together; and a second stranded wire (thick stranded wire) formed by twisting a plurality of first stranded wires together. The second stranded wire may be the electric wire conductor 151. Moreover, for example, a third stranded wire formed by twisting a plurality of second stranded wires together may be the electric wire conductor 151. The electric wire filament of the communication wire 15 may be a singly twisted stranded wire. The first stranded wire may be the electric wire conductor 151.

As described above, the communication wire 15 may be the twisted pair communication wire 16 in which two communication wires 15 are twisted together.

The following configuration example can be given as an example of the electric wire conductor 151 of the communication wire 15. Note that the electric wire conductor 151 of the communication wire 15 should not be construed as being limited to the following example, which is merely illustrative.

The filament diameter of the electric wire filaments is 0.08 mm. The first stranded wire (right-hand twisted, 5 mm pitch) can be formed by twisting 16 electric wire filaments together and the second stranded wire (right-hand twisted, 9 mm pitch) can be formed by twisting three first strands together. The pitch in the 5 mm pitch or the 9 mm pitch in parentheses means a pitch of twisting. As illustrated in FIG. 1A, the second stranded wire formed by twisting three first strands together may be the electric wire conductor 151. At this time, the conductor cross-sectional area S2 of the communication wire 15 is 0.24 $mm^2$. The outer diameter of the communication wire 15 including the electric wire coating 152 is 1.5 mm. Moreover, two communication wires 15 may be twisted together (right-hand twisted, 25 mm pitch) to form the twisted pair communication wire 16. In this case, the outer diameter of the twisted pair communication wire 16 is 3.0 mm.

In another example, the electric wire conductor 151 of the communication wire 15 may be a singly twisted stranded wire. That is, the above-described first stranded wire may be the electric wire conductor. When the electric wire conductor 151 of the communication wire 15 is a singly twisted stranded wire, the outer diameter of the communication wire 15 or the like can be reduced. For example, the first stranded wire (right-hand twisted, 12 mm pitch) can be formed by twisting 48 electric wire filaments together. The first stranded wire may be the electric wire conductor 151. At this time, the conductor cross-sectional area S2 of the communication wire 15 is 0.24 mm². The outer diameter of the communication wire 15 including the electric wire coating 152 is 1.1 mm. Moreover, two communication wires 15 may be twisted together (right-hand twisted, 20 mm pitch) to form the twisted pair communication wire 16. The outer diameter of the twisted pair communication wire 16 is 2.2 mm.

The filament diameter of the filaments of the electric wire filaments or the like can be measured and calculated in the following manner in accordance with, for example, JIS C3002 (1992).

First, in a given cross section of a filament perpendicular to the longitudinal direction thereof, two orthogonal diameters of the filament are measured by a micrometer for a filament diameter of the filament. Then, an average value of the measured diameters can be used as the filament diameter of the filament. In the present specification, the filament diameter of the filament can be measured and calculated in the same manner.

Moreover, as in the case of the multicore cable 10 as illustrated in FIG. 1A, when the multicore cable 10 includes the electric power supply wire 14 and the communication wire 15 as the coated electric wires 11, the conductor cross-sectional area S1 of the electric wire conductor 141 included in the electric power supply wire 14 is, for example, 1.5 mm² or more and 2.5 mm² or less. In this case, the conductor cross-sectional area S2 of the electric wire conductor 151 included in the communication wire 15 is, for example, 0.1 mm² or more and 0.5 mm² or less.

The conductor cross-sectional area S2 of the electric wire conductor 151 included in the communication wire 15 is preferably smaller than the conductor cross-sectional area S1 of the electric wire conductor 141 included in the electric power supply wire 14. More preferably, the conductor cross-sectional area S1 of the electric wire conductor 141 included in the electric power supply wire 14 is three times or more and 15 times or less the conductor cross-sectional area S2 of the electric wire conductor 151 included in the communication wire 15.

The conductor cross-sectional area of the electric wire conductor can be calculated in accordance with the following procedure. First, the filament diameter of the electric wire filament constituting the electric wire conductor is measured and calculated by the above-described method. Then, the cross-sectional area of the electric wire filament is calculated using the obtained filament diameter. By calculating a product of the cross-sectional area of the electric wire filament and the number of electric wire filaments included in the electric wire conductor, the conductor cross-sectional area of the electric wire conductor can be calculated.

No particular limitation is imposed on the material of the electric wire filament included in the coated electric wire 11. Examples thereof include copper, aluminum, copper alloys, and the like. The surface of the electric wire filament may be plated with silver or tin. For this reason, a silver-plated copper alloy, a tin-plated copper alloy, or the like may be used as the material of the electric wire filament.

No particular limitation is imposed on the material of the electric wire coating. For example, it is possible to use one or more resins selected from: fluororesins, such as polytetrafluoroethylene (PTFE), tetrafluoroethylene-perfluoroalkyl vinyl ether copolymers (PFA), tetrafluoroethylene-hexafluoropropylene copolymers (FEP), ethylene-tetrafluoroethylene copolymers (ETFE), and the like; polyester resins, such as polyethylene terephthalate (PET) and the like; and polyolefin resins, such as polyethylene, polypropylene, and the like. The resin of the electric wire coating may or may not be cross-linked.

In addition to the resin, the electric wire coating may also include additives, such as a flame retardant, a flame-retardant aid, an antioxidant, a lubricant, a colorant, a reflectivity-imparting agent, a concealing agent, a processing stabilizer, and a plasticizer, and the like.

(1-2) Detection Wire (1-2-1) Configuration

The detection wire 12 is an electric wire configured to cause damage or breakage (disconnection) by itself, thereby detecting that a sign indicating potential disconnection is occurring in the coated electric wire 11.

As used herein, breakage or disconnection means not only that the detection wire, the shield layer, or the like is actually disconnected, but also that a part of the detection wire, the detection wire filament, or the shield layer is damaged or disconnected, and the film thickness is reduced. In addition to measuring the electrical resistance of a single conductor, such as the detection wire or the shield layer, an inspection signal including an AC component is input to two conductors, and characteristic impedance between the two conductors is measured as a response signal, so that an abnormality before disconnection can be detected further accurately.

As illustrated in FIG. 1A, the detection wire 12 may include a detection wire conductor 121 that is a stranded wire of a plurality of detection wire filaments, and may also include a detection wire coating 122 that covers the outer surface of the detection wire conductor 121.

In the example as illustrated in FIG. 1A, the multicore cable 10 includes a single detection wire 12. However, this is by no means a limitation. The multicore cable 10 may include a plurality of detection wires 12. When a plurality of detection wires 12 are provided, it is enough that at least one of the detection wires 12 is disposed in the region enclosed by: the two electric power supply wires 14 disposed so as to be next to each other; and the sheath 13.

The electric power supply wire 14 is, for example, a coated electric wire configured to supply electric power to the motor of an electric brake. The electric power supply wire 14 is an important coated electric wire. By disposing the detection wire 12 in the region enclosed by: the two electric power supply wires 14 disposed so as to be next to each other; and the sheath 13, an approximately equal quantity of load is applied to both the detection wire conductor 121 of the detection wire 12 and the electric power supply wire 14 of the coated electric wires 11 when the multicore cable 10 repeatedly receives a load through bending or vibrating. Therefore, when a load is repeatedly applied to the multicore cable of the present embodiment through bending or vibrating, an approximately equal quantity of load is supposed to be applied to both the detection wire conductor 121 of the detection wire 12 and the electric wire conductor 141 of the electric power supply wires 14. Electrical characteristics of the detection wire conductor 121, such as characteristic impedance and the like, are measured, and the state of the detection wire conductor 121, such as damage, breakage, and the like of the detection wire conductor 121, can be detected from changes in measured values. Therefore, by measuring the electrical characteristics of the detection wire conductor 121, it is possible to detect that a sign indicating potential disconnection is occurring in the electric power supply wire 14 before disconnection of the electric power supply wire 14 that is important among the coated electric wires 11. That is, disconnection of the electric power supply wire 14 that is the coated electric wire 11 can be predicted.

In the following, prediction of disconnection of the electric power supply wire will be mainly described. However, in the multicore cable of the present embodiment, disconnection of the coated electric wires other than the electric power supply wire 14 can also be predicted. For example, by previously evaluating measurement values of electrical characteristics of the detection wire conductor and extents of damage and breakage of the coated electric wires 11 other than the electric power supply wire 14, it is possible to evaluate the extents of damage and breakage of the coated electric wires 11 other than the electric power supply wire 14, and predict disconnection of the coated electric wires 11 concerned.

(Detection Wire Filament and Detection Wire Conductor)

According to studies performed by the inventors of the present invention, bending characteristics of an electric wire, such as a coated electric wire or the like, are influenced by the filament diameter of filaments constituting a conductor, and an electric wire including filaments having a larger diameter is more likely to be disconnected by application of a load through repeated bending. Therefore, the filament diameter of the detection wire filaments included in the detection wire 12 is preferably equal to or greater than the filament diameter of the electric wire filaments included in the electric power supply wire 14.

For example, the filament diameter of the detection wire filaments included in the detection wire 12 can be made equal to the filament diameter of the electric wire filaments included in the electric power supply wire 14.

As described above, an approximately equal quantity of load is applied to both the detection wire 12 and the electric power supply wire 14 when the multicore cable 10 of the present embodiment is repeatedly bent. Therefore, when the filament diameter of the detection wire filaments included in the detection wire 12 is made equal to the filament diameter of the electric wire filaments included in the electric power supply wire 14, disconnection of the electric power supply wire 14 can be predicted at an appropriate timing.

Also, the filament diameter of the detection wire filaments included in the detection wire 12 may be greater than the filament diameter of the electric wire filaments included in the electric power supply wire 14. When the filament diameter of the detection wire filaments included in the detection wire 12 is greater than the filament diameter of the electric wire filaments included in the electric power supply wire 14, the detection wire 12 is more likely to be disconnected than is the electric power supply wire 14 when the multicore cable 10 is bent repeatedly. Therefore, disconnection of the electric power supply wire 14 can be predicted at an early stage with high accuracy.

When the multicore cable includes a plurality of types of coated electric wires, preferably, the filament diameter of the detection wire filaments included in the detection wire is, at least, equal to or greater than the filament diameter of the electric wire filaments of the coated electric wire 11 that is required of prediction of disconnection.

As illustrated in FIG. 1A, when the multicore cable 10 includes the electric power supply wire 14 and the communication wire 15, preferably, the filament diameter of the detection wire filaments included in the detection wire 12 is, at least, equal to or greater than the filament diameter of the electric wire filaments included in the electric power supply wire 14, as described above. That is, when the filament diameter of the detection wire filaments included in the detection wire 12 is denoted by D1211 and the filament diameter of the electric wire filaments included in the electric power supply wire 14 is denoted by D1411, a relation of D1211≥D1411 is preferably satisfied. As described above, a relation of D1211>D1411 may be satisfied.

The filament diameter of the detection wire filaments included in the detection wire 12 is preferably equal to or greater than the filament diameter of the electric wire filaments included in all of the coated electric wires included in the multicore cable 10. In the case of the multicore cable 10, the filament diameter of the detection wire filaments included in the detection wire 12 preferably has the following relations with the filament diameter of the electric wire filaments of the electric power supply wire 14 and the filament diameter of the electric wire filaments of the communication wire 15, i.e., D1211≥D1411 and D1211≥D1511. Relations of D1211>D1411 and D1211>D1511 may be satisfied. In the above formulae, D1211 denotes the filament diameter of the detection wire filaments included in the detection wire 12, D1411 denotes the filament diameter of the electric wire filaments included in the electric power supply wire 14, and D1511 denotes the filament diameter of the electric wire filaments included in the communication wire 15. The same applies hereinafter.

The filament diameter of the detection wire filaments included in the detection wire 12 may be made equal to the filament diameter of the electric wire filaments of all of the coated electric wires included in the multicore cable 10. In the case of the multicore cable 10, the filament diameter of the detection wire filaments included in the detection wire 12 may have the following relation with the filament diameter of the electric wire filaments included in the electric power supply wire 14 and the filament diameter of the electric wire filaments included in the communication wire 15, i.e., D1211=D1411=D1511. When the filament diameter of the filaments included in the coated electric wire 11 is equal to the filament diameter of the filaments included in the detection wire 12, the number of types of the filaments required for production of the multicore cable can be decreased, and productivity can be enhanced.

For example, the conductor cross-sectional area S3 of the detection wire conductor 121 may be 0.08 mm² or more and 0.42 mm² or less. The conductor cross-sectional area S3 of the detection wire conductor 121 included in the detection wire 12 is preferably smaller than the conductor cross-sectional area S1 of the electric wire conductor 141 included in the electric power supply wire 14. Also, the conductor cross-sectional area S3 of the detection wire conductor 121 included in the detection wire 12 is preferably equal to or smaller than the conductor cross-sectional area S2 of the electric wire conductor 151 included in the communication wire 15.

Therefore, when the coated electric wire 11 includes the electric power supply wire 14 and the communication wire 15, the conductor cross-sectional area S1 of the electric wire conductor 141 included in the electric power supply wire 14, the conductor cross-sectional area S2 of the electric wire conductor 151 included in the communication wire 15, and the conductor cross-sectional area S3 of the detection wire conductor 121 preferably satisfy a relation of formula (A).

$$S1 > S2 \geq S3 \tag{A}$$

When the relation of formula (A) is satisfied by the conductor cross-sectional area S1 of the electric wire conductor 141 included in the electric power supply wire 14, the conductor cross-sectional area S2 of the electric wire conductor 151 included in the communication wire 15, and the conductor cross-sectional area S3 of the detection wire conductor 121 included in the detection wire 12, the detection wire 12 can be appropriately disposed in a region A. The region A is a region enclosed by: the two electric power supply wires 14 disposed so as to be next to each other; and the sheath 13.

As described above, the electric wire conductor 141 of the electric power supply wire 14 may include: a first stranded wire (thin strand) formed by twisting the electric wire filaments together; and a second stranded wire (thick strand) formed by twisting a plurality of first strands together. In this case, the pitch of twisting of the detection wire conductor 121 is preferably longer than the pitch of twisting of the first stranded wire included in the electric power supply wire 14.

When the pitch of twisting of the detection wire conductor 121 is longer than the pitch of twisting of the first stranded wire included in the electric power supply wire 14, the detection wire 12 is more likely to be disconnected than is the electric power supply wire 14. Therefore, by measuring the electrical characteristics of the detection wire conductor 121 included in the detection wire 12 and evaluating the state of the detection wire conductor 121, it is possible to predict disconnection of the electric power supply wire 14 at an early stage with high accuracy, the electric power supply wire 14 having an especially high demand for prediction of disconnection among the coated electric wires 11 included in the multicore cable 10.

The pitch of twisting means a length by which a cable, such as a strand-constituting filament or the like, is twisted around once. The above length means a length along the center axis of the strand.

FIG. 4 is a side view of a stranded wire 40. The stranded wire 40 has a structure in which a total of 10 cables, i.e., cables 400 to 409, are twisted together.

In this case, as illustrated in FIG. 4, on the side surface of the stranded wire 40, the distance between portions of the same cable (e.g., cable 400) along a center axis CA is a pitch of twisting Pt of the stranded wire 40. The pitch of twisting is obtained by measuring the pitch of twisting Pt.

In the present specification, the pitch of twisting and the winding pitch can be measured and calculated in the same manner.

When the coated electric wire 11 includes the communication wire 15, as described above, the electric wire conductor 151 of the communication wire 15 may include: a first stranded wire (thin strand) formed by twisting the electric wire filaments together; and a second stranded wire (thick strand) formed by twisting a plurality of first strands together. In this case, the pitch of twisting of the detection wire conductor 121 is preferably longer than the pitch of twisting of the first stranded wire included in the communication wire 15.

The electric wire conductor 151 of the communication wire 15 may be a singly twisted stranded wire. In this case, the pitch of twisting of the detection wire conductor 121 is preferably longer than the pitch of twisting of the electric wire conductor 151 included in the communication wire 15.

When the pitch of twisting of the detection wire conductor 121 is longer than the pitch of twisting of the first stranded wire included in the communication wire 15, the detection wire 12 is more likely to be disconnected than is the communication wire 15. The same applies when the electric wire conductor 151 of the communication wire 15 is a singly twisted stranded wire, and the pitch of twisting of the detection wire conductor 121 is longer than the pitch of twisting of the electric wire conductor 151 included in the communication wire 15.

Therefore, by measuring the electrical characteristics of the detection wire conductor 121 included in the detection wire 12 and evaluating the state of the detection wire conductor 121, it is possible to predict disconnection of the communication wire 15 at an early stage with high accuracy.

The following configuration examples can be given as examples of the filament diameter of the electric wire filaments included in the coated electric wire 11 and the filament diameter of the detection wire filaments included in the detection wire 12 in the multicore cable 10. Note that these should not be construed as being limited to the following examples, which are merely illustrative.

In a first example, the filament diameter of the detection wire filaments included in the detection wire 12 may be equal to the filament diameter of the electric wire filaments of one or more coated electric wires selected from the electric power supply wire 14 and the communication wire 15. For example, the filament diameter of the electric wire filaments of the electric power supply wire 14 and the communication wire 15 is 0.08 mm as in the configuration example described above. The filament diameter of the detection wire filaments is also 0.08 mm. The detection wire conductor 121 is formed by twisting 42 detection wire filaments together (right-hand twisted, 14 mm pitch). At this time, the conductor cross-sectional area S3 of the detection wire 12 is 0.21 mm$^2$. The outer diameter of the detection wire 12 including the detection wire coating is 1.3 mm.

In a second example, the filament diameter of the detection wire filaments included in the detection wire 12 is greater than the filament diameter of the electric wire filaments of one or more coated electric wires selected from the electric power supply wire 14 and the communication wire 15. For example, the filament diameter of the electric wire filaments of the electric power supply wire 14 and the communication wire 15 is 0.08 mm as in the configuration example described above. The filament diameter of the detection wire filaments is 0.10 mm. The detection wire conductor 121 is formed by twisting 28 detection wire filaments together (right-hand twisted, 14 mm pitch). At this time, the conductor cross-sectional area S3 of the detection wire 12 is 0.22 mm$^2$. The outer diameter of the detection wire 12 including the detection wire coating is 1.3 mm. With this configuration, the detection wire filament of the second example is more likely to be disconnected than is the detection wire filament of the first example.

In both of the above-described examples, in order for the detection wire 12 to be more likely to be disconnected than is the electric power supply wire 14, for example, the pitch of twisting of the detection wire conductor 121 included in the detection wire 12 is preferably longer than the pitch of twisting of the first stranded wire of the electric wire conductor 141 included in the electric power supply wire 14.

Also, in order for the detection wire 12 to be more likely to be disconnected than is the communication wire 15, for example, the pitch of twisting of the detection wire conductor 121 included in the detection wire 12 is preferably longer than the pitch of twisting of the first stranded wire of the electric wire conductor 151 included in the communication wire 15.

When the electric wire conductor 151 of the communication wire 15 is a singly twisted stranded wire, for example, the pitch of twisting of the detection wire conductor 121 included in the detection wire 12 is preferably longer than the pitch of twisting of the electric wire conductor 151 included in the communication wire 15.

No particular limitation is imposed on the material of the detection wire filament. Examples thereof include copper, aluminum, copper alloys, and the like. The surface of the detection wire filament may be plated with silver or tin. For this reason, a silver-plated copper alloy, a tin-plated copper alloy, or the like may be used as the material of the detection wire filament.

(Detection Wire Coating)

No particular limitation is imposed on the material of the detection wire coating 122. For example, it is possible to use one or more resins selected from: fluororesins, such as polytetrafluoroethylene (PTFE), tetrafluoroethylene-per-fluoroalkyl vinyl ether copolymers (PFA), tetrafluoroethyl-ene-hexafluoropropylene copolymers (FEP), ethylene-tet-rafluoroethylene copolymers (ETFE), and the like; polyester resins, such as polyethylene terephthalate (PET) and the like; and polyolefin resins, such as polyethylene, polypro-pylene, and the like. The resin of the detection wire coating 122 may or may not be cross-linked.

In addition to the resin, the detection wire coating 122 may also include additives, such as a flame retardant, a flame-retardant aid, an antioxidant, a lubricant, a colorant, a reflectivity-imparting agent, a concealing agent, a process-ing stabilizer, and a plasticizer, and the like.

(Shield Conductor and Outer Surface Coating)

As illustrated in FIG. 2, the detection wire may be formed of a coaxial cable. That is, the detection wire 120 may include: the detection wire conductor 121 that is the stranded wire of the detection wire filaments; the detection wire coating 122 that covers the outer surface of the detection wire conductor 121; and a shield conductor 123 that covers the outer surface of the detection wire coating 122. The shield conductor 123 may be formed by twisting a plurality of shield filaments together, or may be formed of a metal foil, such as copper foil. In addition, the detection wire 120 may include an outer surface coating 124 that covers the outer surface of the shield conductor 123.

When measuring characteristic impedance between two conductors, for example, a measurement device is connected between the detection wire conductor 121 of the detection wire 12, and the shield conductor 123. When the position of the detection wire conductor 121 of the detection wire 12 and the position of the shield conductor 123 are constant and no other coated electric wire is placed therebetween, noise in measuring characteristic impedance can be suppressed and measurement can be performed stably. Further, by providing the outer surface of the shield conductor 123 with the outer surface coating 124, the shield conductor 123, the detection wire coating 122, and the detection wire conductor 121 can be protected. Therefore, the detection wire conduc-tor 121 can be prevented from disconnection separately from the case of detecting a sign indicating potential disconnec-tion of the coated electric wire.

(1-2-2) Disposition

When considering a multicore cable in which included coated electric wires are disposed in point symmetry with the center of a cross section perpendicular to the longitudinal direction as a point of symmetry, the center of bending of the multicore cable coincides with the center of the cross section, and bending strain at the center is 0. Therefore, for example, breakage of the coated electric wire disposed at the center is less likely to occur. In addition, it is possible to predict the magnitude of a load to be applied to the coated electric wires disposed in other places.

As in the multicore cable 10 of the present embodiment, when the center of bending of the multicore cable 10 does not coincide with the center of the cross section, it is especially challenging to predict the magnitude of a load when the multicore cable is repeatedly bent, in accordance with the disposition of the detection wire 12 in the multicore cable 10. In view of this, the inventors of the present invention performed studies to determine the difference in the magnitude of the load when the multicore cable 10 is repeatedly bent, in accordance with the disposition of the detection wire 12 in the multicore cable 10. As a result, it was found that an approximately equal quantity of load is applied to both the detection wire 12 and the electric power supply wire 14 when the multicore cable is repeatedly bent, by disposing the detection wire 12 in the region enclosed by: the two electric power supply wires 14 disposed so as to be next to each other; and the sheath 13 in the cross section perpendicular to the longitudinal direction of the multicore cable 10.

In addition, when the center of bending of the multicore cable does not coincide with the center of the cross section, the magnitude of the load applied to the detection wire 12 differs in accordance with the disposition of the detection wire 12 in the multicore cable. Thus, it is especially chal-lenging to predict breakage of the coated electric wire 11 from the evaluation results of the detection wire 12. Spe-cifically, for example, when producing multicore cables including cores formed by twisting a plurality of coated electric wires and detection wires together, the detection wire 12 is likely to be displaced and the timing of breakage is likely to differ for each of the multicore cables of different production lots. Meanwhile, according to the multicore cable 10 of the present embodiment, the detection wire 12 is disposed in the region enclosed by: the two electric power supply wires 14 disposed so as to be next to each other; and the sheath 13 in the cross section perpendicular to the longitudinal direction of the multicore cable 10. With this configuration, the disposition of the detection wire 12 in the multicore cable is stable even for multicore cables of dif-ferent production lots. This configuration also contributes to suppression in displacement of the coated electric wire 11 and the detection wire 12 over time at a position along the longitudinal direction.

From the results of the studies, according to the multicore cable 10 of the present embodiment, the detection wire 12 is preferably disposed in the region enclosed by: the two electric power supply wires 14 disposed so as to be next to each other; and the sheath 13 in the cross section perpen-dicular to the longitudinal direction.

With the above disposition, even if the coated electric wires having different configurations are disposed along the circumferential direction in the cross section perpendicular to the longitudinal direction of the multicore cable, and the coated electric wires are not disposed in point symmetry with the center of the cross section as a point of symmetry, an approximately equal quantity of load is applied to both the detection wire and the electric power supply wire when the multicore cable is repeatedly bent. In addition, by disposing the detection wire in the region enclosed by: the two electric power supply wires disposed so as to be next to each other; and the sheath, the position of the detection wire in the core becomes stable even if the multicore cable is repeatedly bent. Therefore, by measuring the electrical characteristics of the detection wire conductor included in the detection wire and evaluating the state of the detection wire conductor, disconnection of the coated electric wire can be predicted at an appropriate timing.

When a gap or filler is provided between the two electric power supply wires 14, the detection wire 12 is disposed in a region enclosed by: a line connecting the centers of the two electric power supply wires 14 next to each other; outer peripheries of the two electric power supply wires 14 next to each other; and the sheath 13.

Also, when the electric power supply wires 14 are in contact with the sheath 13 via a filler 19, the detection wire 12 is disposed in a region enclosed by: the filler 19; the two electric power supply wires 14 disposed so as to be next to each other; and the sheath 13. When the electric power supply wires 14 are in connected to a wrapping 18 or a shield layer 20 via the filler 19, the detection wire 12 is disposed in a region enclosed by: the filler 19; the two electric power supply wires 14 disposed so as to be next to each other; and the wrapping 18 or the shield layer 20.

As described above, the multicore cable 10 may include the two communication wires 15, and the two communication wires 15 may be twisted together to form the twisted pair communication wire 16. In this case, for example, as illustrated in FIG. 1A, the twisted pair communication wire 16 can be disposed in a region enclosed by: the two electric power supply wires 14 disposed so as to be next to each other; and the sheath 13. Preferably, in the cross section perpendicular to the longitudinal direction of the core 17, the region in which the detection wire 12 is disposed and the region in which the twisted pair communication wire 16 is disposed are disposed so as to sandwich the two electric power supply wires 14 disposed so as to be next to each other.

By disposing the detection wire 12 and the twisted pair communication wire 16 in the above-described manner, interference between signals from the detection wire 12 and the twisted pair communication wire 16 is suppressed, and more accurate signals can be transmitted.

The region enclosed by: the two electric power supply wires 14 disposed so as to be next to each other; and the sheath 13 in the cross section perpendicular to the longitudinal direction of the multicore cable 10 means, for example, the region A in the configuration of the multicore cable 10 of FIG. 1A.

Simulation results of a relation between the disposition of the detection wire 12 and the magnitude of a load applied to the detection wire are given in FIG. 6A and FIG. 6B.

The above simulation results are simulation results of a bending endurance test as illustrated in FIG. 5. The bending endurance test can be performed in accordance with the following procedure. First, as illustrated in FIG. 5, a multicore cable 50 to be evaluated is disposed and held between a first mandrel 511 and a second mandrel 512 that each have a diameter of 20 mm and are disposed horizontally and parallel to each other. Subsequently, a load of 500 g is applied vertically downward to the multicore cable 50. In this state, the upper end of the multicore cable 50 is horizontally bent by 90° so as to contact the upper surface of the first mandrel 511, and then is horizontally bent by 90° so as to contact the upper surface of the second mandrel 512. This is performed repeatedly.

FIG. 6A and FIG. 6B illustrate changes in the maximum values of the curvatures of the detection wire and the coated electric wire included in the multicore cable when the angle of bending and direction of the multicore cable are changed from step to step in the above-described bending endurance test. The maximum values of the curvatures indicate the extent to which the detection wire and the coated electric wire are bent, i.e., they correspond to the load applied to the detection wire and the coated electric wire.

FIG. 6A is a graph of the simulation results obtained when the multicore cable 10 as illustrated in FIG. 1A, in which the detection wire 12 is disposed in the region A enclosed by: the two electric power supply wires 14 disposed so as to be next to each other; and the sheath 13, is subjected to the bending endurance test.

FIG. 6B is a graph of the simulation results obtained when the multicore cable 111 as illustrated in FIG. 1D, in which a detection wire 12A is disposed outside the region A disclosed by: the two electric power supply wires 14 disposed so as to be next to each other; and the sheath 13, is subjected to the bending endurance test. In the multicore cable 111, the detection wire 12A is disposed to be closer to the center of the multicore cable, specifically, in a region enclosed by the coated electric wires 11. The multicore cable 111 as illustrated in FIG. 1D has the same configuration as that of the multicore cable 10 as illustrated in FIG. 1A except that the disposition of the detection wire is different.

In FIG. 6A and FIG. 6B, an electric power supply wire 1 and an electric power supply wire 2 correspond to the electric power supply wire 14 in the multicore cable 10 of FIG. 1A, and a communication wire 1 and a communication wire 2 correspond to the communication wire 15 in the multicore cable 10 of FIG. 1A. In FIG. 6A and FIG. 6B, a dotted line 61 indicates a state in which the angle of bending of the multicore cable reaches 90 degrees, i.e., contacts the first mandrel 511, and a dotted line 62 indicates a state in which the angle of bending of the multicore cable reaches-90 degrees, i.e., contacts the second mandrel 512. In FIG. 6A and FIG. 6B, step 0 in the horizontal axis corresponds to a state in which the multicore cable is bent by 0 degrees, and step 2.5 corresponds to a state in which the multicore cable is bent by 90 degrees. Also, step 7.5 corresponds to a state in which the multicore cable is bent by −90 degrees, and step 12.5 corresponds to a state in which the cable is bent by 90 degrees. That is, one step in the horizontal axis corresponds to 18-degree bending.

As illustrated in FIG. 6A, by disposing the detection wire 12 in the region A enclosed by: the two electric power supply wires 14 disposed so as to be next to each other; and the sheath 13, it can be confirmed that the load applied to the detection wire 12 is approximately equal to the load applied to an electric power supply wire 1 and an electric power supply wire 2.

Comparison between FIG. 6A and FIG. 6B indicates that the load applied to the detection wire 12 is suppressed and is approximately equal to the load applied to the electric power supply wire 1 and the electric power supply wire 2 in the configuration in which the detection wire 12 is disposed in the region A, compared to the configuration in which the detection wire 12 is disposed in the region enclosed by the coated electric wires 11.

Accordingly, by disposing the detection wire 12 in the region A enclosed by: the two electric power supply wires 14 disposed so as to be next to each other; and the sheath 13 in the cross section perpendicular to the longitudinal direction of the multicore cable 10, an approximately equal quantity of load is applied to both the detection wire 12 and the electric power supply wire 14 when the multicore cable 10 is repeatedly bent to apply a load to the multicore cable 10. Therefore, by measuring the electrical characteristics of the detection wire conductor 121 included in the detection wire 12 and evaluating the state of the detection wire conductor 121, disconnection of the electric power supply wire 14 can be predicted at an appropriate timing.

(1-3) Core

The multicore cable 10 may include the core 17 including the above-described coated electric wires 11 and the detection wire 12. The core 17 may be formed by twisting the coated electric wires 11 and the detection wire 12 together along the longitudinal direction.

The disposition of the coated electric wires 11 and the detection wire 12, constituting the core 17, may be selected in accordance with the configuration of the coated electric wires 11 included in the core 17. For example, the coated electric wire 11 may include a first electric power supply wire 14A and a second electric power supply wire 14B, which are two electric power supply wires 14 disposed so as to be next to each other. For example, the first electric power supply wire 14A can be connected to the ground potential. In this case, in the core 17, preferably, the first electric power supply wire 14A of the electric power supply wires 14, and the detection wire 12 are disposed so as to contact each other and are twisted together.

As described below, characteristic impedance is measured between: the detection wire 12; and the coated electric wire 11 (the electric power supply wire 14 or the communication wire 15), the shield conductor 123, or the shield layer 20. When the detection wire 12 and the first electric power supply wire 14A connected to the ground potential are twisted in contact with each other, noise in the measurement of the characteristic impedance can be suppressed, and measurement of the characteristic impedance can be performed readily and stably.

As illustrated in FIG. 1A, the detection wire 12 may be twisted in contact with both of the two electric power supply wires 14.

The direction of twisting of the core 17 may be a given direction but is, for example, right-hand twisting.

The pitch of twisting of the core 17 may also be a given pitch of twisting but is, for example, 90 mm.

The above direction of twisting and the above pitch of twisting are examples. These are by no means a limitation.

(1-4) Sheath

The multicore cable 10 may include a sheath 13 covering the outer surface of the core 17. The sheath 13 may be formed as an extrusion molded product of, for example, an insulator including a polymer material as a main component. The sheath 13 may form the outermost surface of the multicore cable 10.

No particular limitation is imposed on the configuration of the sheath 13, which may be formed of, for example, one or more layers. For example, as illustrated in FIG. 1A, the sheath 13 may be formed of two layers, an inner layer 131 and an outer layer 132. In this case, the outer layer 132 disposed at the outermost surface is preferably formed of a material having more excellent mechanical properties, such as abrasion resistance and the like, than in the inner layer 131.

No particular limitation is imposed on the material of the sheath 13. When the sheath 13 includes the inner layer 131 and the outer layer 132 as illustrated in FIG. 1A, the inner layer 131 may include, as a resin component, one or more selected from: polyolefins, such as polyethylene, ethylene-vinyl acetate copolymers (EVA), and the like; polyurethane elastomers; polyester elastomers; and the like.

The outer layer 132, which is disposed at the outermost surface of the multicore cable 10, is preferably a material that is excellent in external-damage resistance and abrasion resistance. The outer layer 132 may include polyurethane or the like as a resin component.

The resin component of the sheath 13 may or may not be cross-linked.

The sheath 13 may also include additives, such as a flame retardant, a flame-retardant aid, an antioxidant, a lubricant, a colorant, a reflectivity-imparting agent, a concealing agent, a processing stabilizer, and a plasticizer, and the like, in addition to the resin component.

(1-5) Shield Layer

As illustrated in FIG. 1B, the multicore cable 100 of the present embodiment may also include the shield layer 20 that covers the outer surface of the core 17. In this case, the shield layer 20 may be disposed between the core 17 and the sheath 13. The detection wire 12 is configured to predict disconnection due to accumulation of metal fatigue in the electric wire conductor of the coated electric wire 11 based on damage or breakage of the detection wire conductor 121 serving as an indicator.

However, in the coated electric wire included in the multicore cable, damage may occur in addition to disconnection of the electric wire conductor due to metal fatigue. For example, disconnection of the electric wire conductor due to metal fatigue progresses over a long period of time due to repeated bending and vibrating, while disconnection of the electric wire conductor may occur by sudden application of a big impact, due to an external force or the like. Moreover, external damage may occur in the coated electric wire due to, for example, contact or friction with respect to an external object, leading to breakage of the electric wire coating or even the electric wire conductor.

According to the detection method using breakage of the detection wire 12 as described above, a sign or the like indicating potential disconnection of the electric wire conductor due to metal fatigue can be detected with high sensitivity. However, it is challenging to detect a sign indicating potential disconnection of the electric wire conductor by sudden application of a big impact and a sign indicating potential formation of external damage on the coated electric wire 11 due to contact or friction with respect to an external object.

In view of this, in addition to the detection wire 12, the multicore cable of the present embodiment includes the shield layer 20 that functions as an outer detection layer. Thereby, the multicore cable of the present embodiment can detect the sign indicating potential damage on the coated electric wire 11 caused by sudden application of an impact or external damage, together with the sign indicating potential disconnection due to metal fatigue. Preferably, the shield layer 20, which functions as the outer detection layer, is not electrically connected to the ground potential or the earth potential in order to receive an input of an inspection signal for measuring characteristic impedance.

No particular limitation is imposed on the disposition of the shield layer 20, which may be disposed outward of the core 17 included in the multicore cable. Although the shield layer 20 can be disposed outward of the sheath 13 to detect the sign indicating potential damage on the coated electric wire 11, the shield layer 20 is preferably disposed inward of the sheath 13 in order to continue to accurately detect damage and protect the shield layer 20 from the external environment. For this reason, the shield layer 20 is preferably disposed between the core 17 and the sheath 13 as described above.

When the multicore cable 100 of the present embodiment includes the wrapping 18 that will be described below, the shield layer 20 is preferably disposed inward of the wrapping 18, for example, between the core 17 and the wrapping 18. By disposing the shield layer 20 inward of the wrapping 18, the shield layer 20 can also be readily removed when the coated electric wire 11 and the detection wire 12 are removed at the longitudinal end of the multicore cable 10.

In the cross section perpendicular to the longitudinal direction of the multicore cable 100, the shield layer 20 is disposed outward of the coated electric wire 11 and the detection wire 12. Therefore, when the multicore cable 100 receives a sudden impact by the action of an external force or receives contact or friction with respect to an external object, the shield layer 20 is more likely to receive a larger quantity of load than do the coated electric wire 11 and the detection wire 12, and is more likely to break. Therefore, by disposing the shield layer 20 and detecting damage or breakage of the shield layer 20, it is possible to detect that a sign indicating potential damage caused by an impact or external damage is occurring in the coated electric wire 11 with high sensitivity. As a result, accuracy in prediction of disconnection of the coated electric wire 11 is increased.

The multicore cable of the present embodiment can detect and predict disconnection of the coated electric wire 11 mainly caused due to metal fatigue by the above-described detection wire 12. In addition, the multicore cable 100 of the present embodiment includes the shield layer 20 that functions as the outer detection layer, and thus it is also possible to detect a sign indicating potential damage on the coated electric wire 11 due to an impact or external damage. Therefore, because the multicore cable 100 of the present embodiment includes the shield layer 20, signs indicating various damage on the coated electric wire 11 can be detected.

No particular limitation is imposed on the configuration of the shield layer 20 as long as the shield layer 20 includes a conductive member. For example, the shield layer 20 may be formed of conductive tape, metal filaments, or braids, as described below.

The shield layer 20 may be as desired as long as the shield layer 20 includes a conductive member as described above. However, the thickness of the conductive member is preferably smaller than the outer diameter of the detection wire conductor 121 of the detection wire 12. The thickness of the conductive member means, for example: the thickness of a conductive layer when the following conductive tape is used; or the thickness of the conductive layer formed by the metal filaments when the metal filaments are used.

When the thickness of the conductive member is smaller than the outer diameter of the detection wire conductor 121, the conductive member of the shield layer is likely to break even by application of a sudden impact that does not lead to breakage of the detection wire 12 or even in receipt of contact or friction with respect to an external object. Therefore, the shield layer 20 can detect a sign indicating potential damage on the coated electric wire 11 with high sensitivity that cannot be detected by the detection wire 12 alone.

The shield layer 20 can be formed by disposing a layer including a conductive material, such as a metal, on the outer surface of the core 17.

For example, the shield layer 20 can be formed by helically winding the conductive tape including the conductive layer on the outer surface of the core 17 along the longitudinal direction of the core 17.

In this case, the conductive layer of the conductive tape can be disposed on an upper surface or a lower surface of the substrate. Therefore, for example, as illustrated in FIG. 3A, the conductive tape 30 can have a stacked structure of a substrate 31 and a conductive layer 32. In the conductive tape 30, the conductive layer 32 is preferably positioned to face the core 17 so as to be electrically connected to a drain wire 21 that will be described below. That is, a surface 30A is preferably positioned to face the core 17. Therefore, the shield layer 20 can have a stacked structure of: the conductive layer 32 disposed to face the core; and the substrate 31 disposed to face the sheath. The conductive tape 30 is preferably helically wound without a gap so as to detect an abnormality over the entirety. When the conductive tape 30 is wound around the core 17, the substrate 31 is provided to face outward. Thereby, the conductive layer 32 does not contact any other conductive layer 32 even when being wound, and can identify a position at which breakage is occurring, as described below.

As described below, the shield layer 20 may be formed such that the substrate faces the core 17. In this case, the shield layer 20 can have a stacked structure of: the substrate 31 disposed to face the core; and the conductive layer 32 disposed to face the sheath.

As illustrated in FIG. 3B, the conductive tape 300 can also have a stacked structure of a first conductive layer 321, the substrate 31, and a second conductive layer 322. In this case, whichever of the surfaces thereof may face the core 17.

FIG. 3A and FIG. 3B are cross-sectional views of each of the constituent layers of the conductive tape in a surface along a stacked direction. When the conductive layer is provided on both surfaces of the substrate as in the conductive tape 300 as illustrated in FIG. 3B, the conductive tape is wound to have a gap with the other conductive tape so as to avoid contact therebetween. With this configuration, it is possible to identify the position at which breakage is occurring.

No particular limitation is imposed on the material of the conductive layer 32, the first conductive layer 321, or the second conductive layer 322. However, the material thereof preferably includes a metal, and may be a metal foil or the like. When the conductive layer 32, the first conductive layer 321, or the second conductive layer 322 includes a metal, no particular limitation is imposed on a metal material. However, the metal material that can be used may be copper, a copper alloy, aluminum, an aluminum alloy, or the like.

No particular limitation is imposed on the material of the substrate 31, which is preferably formed of an insulating material, such as an organic polymer material, a nonwoven fabric, or the like. Examples of the organic polymer material include: polyester resins, such as polyethylene terephthalate (PET) and the like; polyolefin resins, such as polypropylene and the like; and vinyl resins, such as polyvinyl chloride and the like. The substrate 31 may be a substrate including an insulating material, or may be a substrate consisting of an insulating material.

As described above, when the conductive tape is wound to form the shield layer 20, a direction of winding of the conductive tape may be a given direction. For example, the direction of winding may be the same direction as or a different direction from the direction of twisting of the above-described core 17. Especially preferably, the direction of winding of the conductive tape is the same as the direction of twisting of the core 17.

A pitch of winding of the conductive tape may be a given pitch. As one example, the pitch of winding is 18 mm.

The above pitch of winding is illustrative and is by no means a limitation.

In the above description, the shield layer 20 functions as the outer detection layer. However, the shield layer 20 may be simply used for shielding the coated electric wire in the multicore cable. In this case, the shield layer 20 is electrically connected to the ground potential or the earth potential.

A material for fixing the conductive tape, such as an adhesive, may or may not be disposed between the core 17 and the conductive tape.

The shield layer 20 may also be a served or braided shield formed of metal filaments on the outer surface of the core 17. That is, the shield layer 20 may be formed of metal filaments. The material of the metal filaments may be copper, aluminum, a copper alloy, or the like. Therefore, the metal filaments may also be hard copper wires or the like. The surfaces of the metal filaments may be plated with silver or tin. Therefore, for example, the material of the metal filaments may be a silver-plated copper alloy, a tin-plated copper alloy, or the like.

(1-6) Drain Wire

As illustrated in FIG. 1B, the multicore cable 100 of the present embodiment may include the drain wire 21. The drain wire 21 is preferably in contact with the above-described shield layer 20. More specifically, when the shield layer 20 is formed of the conductive tape 30, the drain wire 21 is preferably in contact with the conductive layer 32.

In order to evaluate whether or not the shield layer 20 breaks, it is necessary to electrically connect the shield layer 20 to an external measurement device. When the shield layer 20 is formed of the above-described conductive tape or the like, it may be challenging to directly connect the shield layer 20 to a terminal. For this reason, the drain wire 21 is provided, and the drain wire 21 is brought into contact with the shield layer 20, e.g., the conductive layer 32, the first conductive layer 321, or the second conductive layer 322 as described above. Thereby, the shield layer 20 can be readily connected to the terminal via the drain wire 21.

It is enough that the drain wire 21 is in contact with the shield layer 20 in at least one place, i.e., electrical connection is achieved therebetween. However, the drain wire 21 is preferably in contact with the shield layer 20 in a plurality of places along the longitudinal direction of the drain wire 21.

No particular limitation is imposed on the configuration of the drain wire 21. Preferably, the drain wire 21 is, for example, a stranded wire formed by twisting a plurality of drain wire filaments together.

No particular limitation is imposed on the filament diameter and number of the drain wire filaments, which may be selected in accordance with the electrical characteristics required for the drain wire 21. For example, the filament diameter of the drain wire filaments is preferably 0.05 mm or more and 0.16 mm or less and more preferably 0.05 mm or more and 0.10 mm or less. The following configuration examples can be given as the configurations of the filament diameter of the drain wire filaments included in the drain wire 21 and the conductor cross-sectional area of the drain wire 21. These are not limited to the following examples, which are merely illustrative.

In one example, the filament diameter of the drain wire filaments is 0.08 mm. The drain wire 21 is formed by twisting 42 drain wire filaments together (right-hand twisted, 12 mm pitch). At this time, the conductor cross-sectional area of the drain wire 21 is 0.21 mm$^2$.

No particular limitation is imposed on the material of the drain wire filaments. However, examples thereof include copper, aluminum, copper alloys, and the like. The surfaces of the drain wire filaments may be plated with silver or tin. For this reason, the material of the drain wire filaments may be a silver-plated copper alloy, tin-plated copper alloy, or the like.

In order to electrically connect the drain wire 21 to the above-described shield layer 20, no coating is preferably provided on the surface of a stranded wire of the drain wire filaments.

In the above description, the shield layer 20 and the drain wire 21 are electrically connected. The shield layer 20 and the drain wire 21 may not be electrically connected. This is a configuration in which the substrate 31 is positioned to face the core 17, and the substrate 31 and the drain wire 21 are in contact with each other. In this case, the shield layer 20 may have a stacked structure of: the substrate 31 including an insulating material and disposed to face the core 17; and the conductive layer 32. In this state, the substrate 31 and the drain wire 21 may be in contact with each other.

In the above case, the drain wire 21 is electrically connected to the ground potential, and the shield layer 20 functions as the outer detection layer. When the shield layer 20 is wound in contact with the drain wire 21, noise in the measurement of characteristic impedance is suppressed, and the measurement of the characteristic impedance can be performed readily and stably.

(1-7) Wrapping

The multicore cable 10 of the present embodiment may also include the wrapping 18 that covers the outer surface of the core 17. For example, the wrapping 18 is suitably a form in which a tape body formed of an insulating material, such as paper, a nonwoven fabric, or a resin (e.g., polyester or the like) is helically wound around the outer surface of the core 17 along the longitudinal direction of the core 17.

When the wrapping 18 is disposed around the outer surface of the core 17, the wrapping 18 plays a role in bundling the coated electric wires 11 and the detection wire 12 constituting the core 17 so that the positions thereof do not become away from each other. Therefore, the wrapping 18 can suppress displacement of the coated electric wires 11 and the detection wire 12 in the core 17. That is, the positional relation between the coated electric wires 11 and the detection wire 12 can be suppressed from changing from position to position along the longitudinal direction or from changing over time. Therefore, when an external force, such as bending, vibrating, or the like, is applied to the multicore cable, the relation between the load received by the coated electric wires 11 and the load received by the detection wire 12 is readily maintained constant regardless of the longitudinal position of the multicore cable and regardless of time. Therefore, when breakage occurs in the detection wire conductor 121 of the detection wire 12, the breakage detected can be an indicator that the same extent of metal fatigue is accumulated in the electric wire conductor 141 of the electric power supply wire 14 and a sign indicating potential disconnection is occurring in the electric power supply wire 14 regardless of the position along the longitudinal direction of the multicore cable and regardless of time. That is, the sign indicating potential disconnection of the electric power supply wires 14 can be accurately detected with sensitivity independent of the position or time.

Further, by disposing the wrapping 18 on the outer surface of the core 17, it is possible to prevent direct contact between the core 17 and the sheath 13. Thus, the sheath 13 can be readily delaminated when the coated electric wire 11 and the detection wire 12 are removed at the longitudinal end of the multicore cable 10.

As described above, when the wrapping 18 is formed by wrapping the tape body around the outer surface of the core 17, the direction of winding of the wrapping 18 may be a given direction, for example, may be the same direction as or a different direction from the direction of twisting of the above-described core 17. Especially preferably, the direction of winding of the wrapping 18 is the same as the direction of twisting of the core 17.

A pitch of winding of the wrapping 18 is preferably shorter than the pitch of winding of the core 17. This is because when the pitch of winding of the wrapping 18 is shorter than the pitch of winding of the core 17, it is possible to suppress the tape body forming the wrapping 18 from entering recesses formed by spaces by the coated electric wires 11 or the detection wire 12 forming the core, and to smooth the surface of the wrapping 18. The pitch of winding of the wrapping 18 may be as desired. However, in one example, the pitch of winding is 20 mm.

The above pitch of winding is illustrative, and is by no means a limitation.

(1-8) Filler

The multicore cable 10 of the present embodiment may also include a filler 19 that is disposed in a region enclosed by the sheath 13, for example, in the core 17. The filler 19 may be formed of fibers, such as spun rayon yarns, nylon yarns, and the like. The filler may be formed of high tensile strength fibers.

When the multicore cable 10 includes the filler 19 in the region enclosed by the sheath 13, it is possible to prevent displacement of the detection wire 12 upon bending of the multicore cable 10, and displacement of the detection wire 12 over time. Further, accuracy of the detection wire 12 in prediction of disconnection of the coated electric wire 11 can be increased.

For example, in the example of the multicore cable 110 as illustrated in FIG. 1C, the filler 19 may be disposed so as to contact the detection wire 12 and the first electric power supply wire 14A.

As described above, the multicore cable 10 of the present embodiment may include, as the coated electric wires, the first electric power supply wire 14A and the second electric power supply wire 14B, which are two electric power supply wires.

In this case, as in the multicore cable 110 as illustrated in FIG. 1C, the filler 19 may be disposed so as to contact the first electric power supply wire 14A and the detection wire 12. An unillustrated second filler may be disposed so as to contact the second electric power supply wire 14B and the detection wire 12.

By disposing the filler 19 in the above-described manner so as to contact the detection wire 12 and the electric power supply wire 14, it is possible to prevent displacement of the detection wire 12 upon bending of the multicore cable 110 or displacement of the detection wire 12 over time. Further, accuracy of the detection wire 12 in prediction of disconnection of the coated electric wire 11 can be increased.

The multicore cable of the present embodiment as described above includes the detection wire 12 in addition to the coated electric wires 11 that perform predetermined functions in apparatuses and the like.

The detection wire 12 is disposed in the region A enclosed by: the two electric power supply wires 14 disposed so as to be next to each other; and the sheath 13 in the cross section perpendicular to the longitudinal direction of the multicore cable.

With this configuration, an approximately equal quantity of load is applied to both the detection wire and the electric power supply wire when the multicore cable is repeatedly bent. Also, the position of the detection wire in the core becomes stable. Therefore, by measuring electrical characteristics of the detection wire conductor included in the detection wire and evaluating the state of the detection wire conductor, disconnection of the electric power supply wire can be predicted at an appropriate timing.

Breakage of the detection wire conductor 121 or the shield layer 20 can be detected by electrical measurement, such as measurement of characteristic impedance or the like. An evaluation method will be described in the following description for a disconnection detector.

The multicore cable of the present embodiment can be used for various applications in which it is required to predict disconnection of a coated electric wire. The multicore cable of the present embodiment is suitable for use in apparatuses, such as automobiles and the like in which bending and vibrating are frequently applied to the multicore cable by movements. For example, the multicore cable of the present embodiment is suitable for use in, for example, electric parking brakes in which parking brakes are electrified. Especially, the multicore cable of the present embodiment is suitably used for applications, such as an electric brake system in which the foot brake of an automobile is electrified. More specifically, the multicore cable of the present embodiment is suitably used for applications in which a large impact can occur if the coated electric wire is disconnected and significance of detecting disconnection of the coated electric wire before happening is high. In the electric brake system, the electric power supply wire is configured to supply electric power for driving a motor, and the communication wire is configured to transmit electric signals related to control of the motor and electric signals related to a rotational speed of the wheels.

[Disconnection Detector]

The disconnection detector of the present embodiment may include the above-described multicore cable and a measurement device connected to the detection wire conductor of the detection wire included in the multicore cable. The measurement device may be configured to input an inspection signal including an AC component to the detection wire conductor and measure characteristic impedance.

Figure 7:
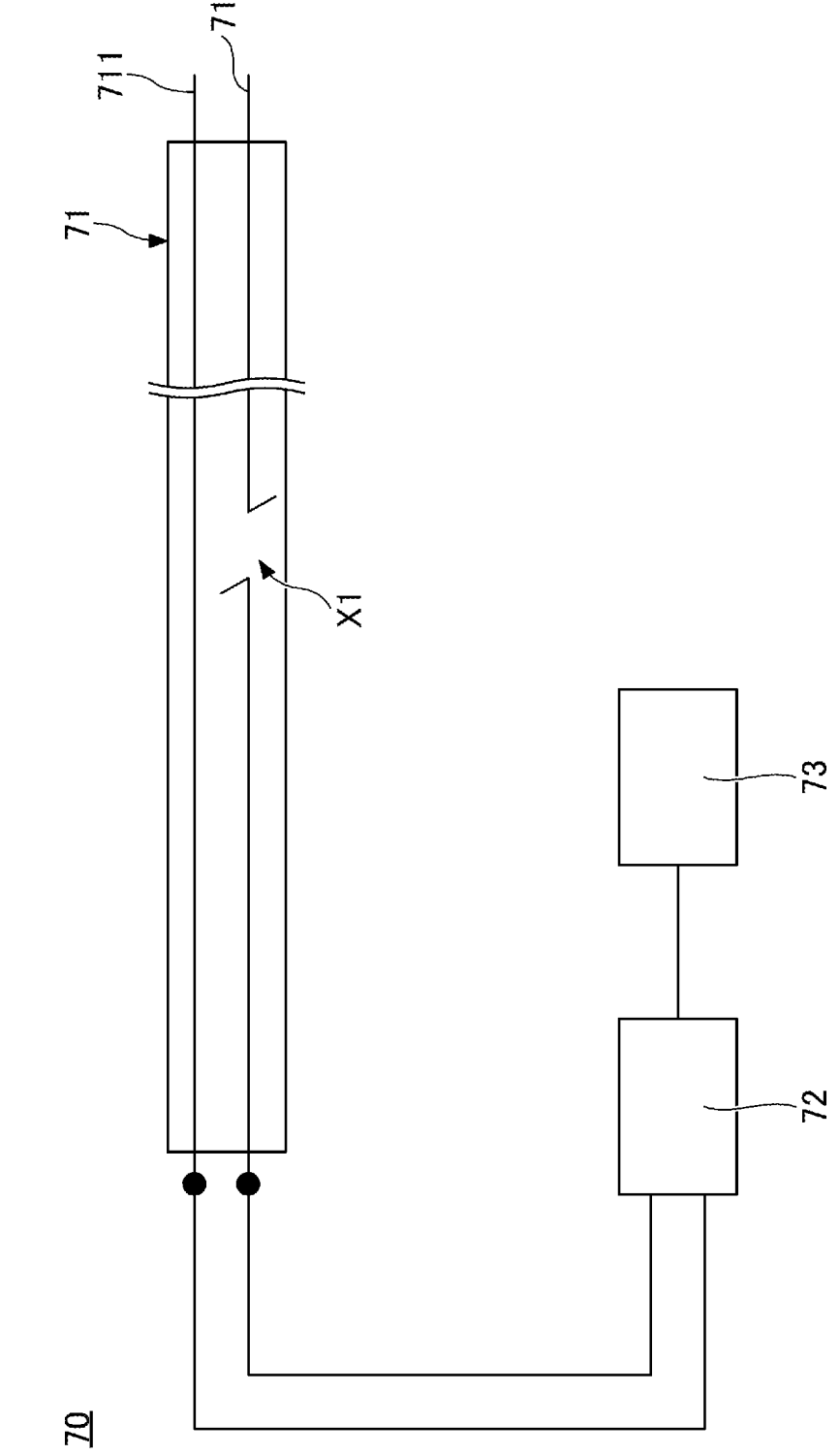
FIG. 7 is an explanatory view of a configuration of a disconnection detector according to one aspect of the present disclosure.

FIG. 7 schematically illustrates a configuration of a disconnection detector 70 according to an embodiment of the present disclosure. The disconnection detector 70 is configured to detect a sign indicating potential disconnection of an electric wire conductor of a coated electric wire, i.e., predict disconnection, in the above-described multicore cable. In FIG. 7, for the sake of convenience, a single electric wire conductor 711 of the coated electric wire and a single detection wire conductor 712 of a detection wire are illustrated as components of the multicore cable 71. FIG. 7 illustrates a state in which an abnormality or breakage X1 is occurring in the detection wire conductor 712.

The disconnection detector 70 may include a measurement device 72. The measurement device 72 is a device configured to measure, for example, characteristic impedance of the detection wire conductor 712 included in the multicore cable 71, and inspect whether or not the abnormality or the breakage X1 is occurring in the detection wire conductor 712. That is, the measurement device 72 can be configured to measure, for example, the characteristic impedance of the detection wire conductor 712. The measurement of the characteristic impedance can be performed by inputting an inspection signal including an AC component to a conductor, for example, the detection wire conductor 712. Preferably, the measurement of the characteristic impedance can be performed by inputting an inspection signal including an AC component to two conductors and measuring the characteristic impedance between the two conductors as a response signal. The measurement of the characteristic impedance between the two conductors may be performed between: the detection wire conductor 712 of interest; and the electric wire conductor of the coated electric wire 11 (the electric power supply wire 14 or the communication wire 15), the shield conductor, or the conductive layer of the shield layer. When the multicore cable includes a plurality of detection wires, the measurement may be performed between the two detection wire conductors 712. The inspection signal including the AC component is input to the two conductors to measure the characteristic impedance. Therefore, the measurement device can be configured, for example, to input the inspection signal including the AC component to the detection wire conductor and the electric wire conductor, and measure the characteristic impedance between the detection wire conductor and the electric wire conductor. The shield conductor or the conductive layer of the shield layer as described above can be used instead of the electric wire conductor. The response signal is obtained by a reflection method or a transmission method. Examples of the measurement device 72 include LCR meters and the like.

When the abnormality or the breakage X1 exists in the middle portion of the detection wire conductor 712, reflection of the inspection signal occurs at the place of the breakage X1. As a result, a discontinuous change occurs in the response signal. Therefore, when a change in the characteristic impedance measured by the measurement device 72 is equal to or greater than a standard value, it is possible to determine that the abnormality or the breakage X1 is occurring in the detection wire conductor 712, and a sign indicating potential disconnection is occurring in the wire conductor 711 of the coated electric wire. That is, disconnection of the coated electric wire can be predicted. The standard value can be previously determined as a threshold of the amount of change regarded to be attributable to the abnormality or the breakage of the detection wire conductor 712, based on the actual measurement result or the like when the abnormality or the breakage X1 is not occurring in the detection wire conductor 712. The change in the characteristic impedance can also be caused by an abnormality, such as damage or the like on the detection wire conductor 712, which does not lead to breakage. Although the change in the characteristic impedance due to breakage is treated as a representative example in the present specification, damage on the detection wire conductor 712 different from the breakage can be similarly used to detect, or predict, a sign indicating potential disconnection of the coated electric wire via the change in the characteristic impedance.

The detection of the abnormality or the breakage X1 of the detection wire conductor 712 is not limited to the measurement of the characteristic impedance between the two conductors, but may be performed by simply measuring electrical resistance of a single conductor (detection wire conductor 712). However, by measuring the characteristic impedance between the two conductors, the abnormality of the detection wire conductor 712 can be detected with higher sensitivity before actual breakage. Especially, when the measurement of the characteristic impedance is performed by the reflection method, the measurement of the characteristic impedance can be performed if the measurement device 72 can be connected only to one end of the multicore cable 71 without connecting the measurement device 72 to both ends of the multicore cable 71. Therefore, if the measurement device 72 can be connected only to one end of the detection wire conductor 712, it is possible to detect a sign indicating potential disconnection of the coated electric wire without removing the multicore cable or removing obstacles. Therefore, if the measurement device 72 can be connected to one end of the detection wire conductor 712 as described above, it is possible to detect a sign indicating potential disconnection of the coated electric wire even if the multicore cable 71 is disposed in a place that is not easily accessible, for example, in the interior of a vehicle, or takes a complicated path.

Further, if the measurement of the characteristic impedance of the detection wire conductor 712 is performed through time domain reflectometry (TDR), it is possible to identify not only the presence or absence of the breakage X1 in the detection wire conductor 712 but also the position at which the breakage X1 is occurring.

When the multicore cable includes the above-described shield layer, breakage of the shield layer can be similarly measured using a measurement device. Therefore, when the multicore cable included in the disconnection detector of the present embodiment includes the shield layer, the disconnection detector of the present embodiment can also include a measurement device connected to the shield layer included in the multicore cable. The measurement device connected to the above-described detection wire conductor and the measurement device connected to the shield layer may be formed as a single measurement device or may be formed as two different measurement devices. When the measurement device connected to the detection wire conductor and the measurement device connected to the shield layer are formed as a single measurement device, a switch or the like is preferably provided on an interconnect so as to perform switching of the connection in accordance with a measurement target.

The detection of breakage of the shield layer is not limited to the measurement of the characteristic impedance between the two conductors, but may be performed by simply measuring electrical resistance of a single conductor (shield layer). However, by measuring the characteristic impedance between the two conductors, the abnormality of the shield layer can be detected with higher sensitivity before actual breakage. When breakage occurs in the shield layer, a discontinuous change in the characteristic impedance occurs. The measurement of the characteristic impedance of the shield layer may be performed between: the shield layer; and the electric wire conductor of the coated electric wire 11 (the electric power supply wire 14 or the communication wire 15), the shield conductor, or the detection wire conductor 712. An inspection signal including an AC component is input to the above two conductors to measure the characteristic impedance. Similar to the detection wire conductor, when the characteristic impedance of the shield layer is measured through TDR, it is possible to identify not only the presence or absence of an abnormality or breakage but also a position at which the breakage is occurring. In the shield layer, a change in the characteristic impedance also occurs due to damage on the shield layer that does not lead to breakage. Although the change in the characteristic impedance due to breakage is treated as a representative example in the present specification, damage on the shield layer different from the breakage can be similarly used to detect a sign indicating potential damage on the coated electric wire via the change in the characteristic impedance.

The disconnection detector 70 of the present embodiment can also include a notification device 73. A signal regarding the measurement result is transmitted from the measurement device 72 to the notification device 73. When it is determined by the measurement device 72 that change in the characteristic impedance of the detection wire conductor 712 or the shield layer is occurring to an extent that is equal to or more than a standard value and that disconnection is occurring in the detection wire conductor 712 or the shield layer, the notification device 73 can notify the exterior of a sign indicating potential disconnection of the wire conductor 711 of the coated electric wire.

No particular limitation is imposed on a specific method of notifying the exterior of the sign. However, examples thereof include: a method of visual notification by providing an apparatus including the multicore cable, such as an automobile or the like, with a display panel or the like serving as the notification device 73; and a method of notification by an alarm. Alternatively, the notification device 73 may be provided as an interlocking device configured to restrict some or all of the functions of the apparatus including the multicore cable 71. Therefore, examples of the notification device 73 include: display devices, such as display panels, warning lights, and the like; transmitters, such as buzzers; controllers configured to perform interlocking; and the like.

In apparatuses including the multicore cable, such as automobiles and the like, preferably, the measurement device 72 or the like is constantly connected to the multicore cable to continuously perform measurement of the characteristic impedance by the measurement device 72, and continue to monitor whether or not a sign indicating potential disconnection is occurring in the coated electric wire. If a sign indicating potential disconnection occurs in the coated electric wire included in the multicore cable 71, the sign indicating potential disconnection can be detected at an early stage, and a user or the like of the apparatus can be notified of the sign via the notification device 73. The user who receives the notification can take measures, such as replacement of the multicore cable, at an early stage, and can use the apparatus for a long period of time without any defects. For example, when possibility or frequency of disconnection occurring in the coated electric wire is low, the measurement device 72 may not constantly monitor a sign indicating potential disconnection of the coated electric wire, and the measurement device 72 may be connected to the multicore cable to perform inspection only at a predetermined timing, such as upon regular inspection of the apparatus including the multicore cable.

According to the disconnection detector of the present embodiment as described above, the above-described multicore cable is used, and thus by measuring electrical characteristics, such as characteristic impedance or the like, of the detection wire conductor included in the detection wire, disconnection of the coated electric wire can be predicted with high accuracy.

REFERENCE SIGNS LIST

10, 100, 110, 111, 50, 71 multicore cable
11 coated electric wire
12, 120, 12A detection wire
121, 712 detection wire conductor
S3 conductor cross-sectional area of detector wire conductor

122 detection wire coating
123 shield conductor
124 outer surface coating
13 sheath
131 inner layer
132 outer layer
14 electric power supply wire
14A first electric power supply wire
14B second electric power supply wire
15 communication wire
16 twisted pair communication wire
141, 151, 711 electric wire conductor
S1 conductor cross-sectional area of electric wire conductor included in electric power supply wire
S2 conductor cross-sectional area of electric wire conductor included in communication wire
142, 152 electric wire coating
17 core
18 wrapping
19 filler
20 shield layer 21 drain wire
A region
X axis
Y Y axis
Z Z axis (longitudinal direction)
30, 300 conductive tape
30A surface
31 substrate
32 conductive layer
321 first conductive layer
322 second conductive layer
40 strand
400-409 cable
CA center axis
Pt pitch of twisting
511 first mandrel
512 second mandrel
61, 62 dotted line
70 disconnection detector
72 measurement device
73 notification device
X1 breakage

The invention claimed is:

1. A multicore cable, comprising:
a plurality of coated electric wires;
a detection wire; and
a sheath, wherein
the coated electric wires include
    an electric wire conductor and an electric wire coating, the electric wire conductor being a stranded wire of a plurality of electric wire filaments, and the electric wire coating covering an outer surface of the electric wire conductor,
the detection wire includes
    a detection wire conductor that is a stranded wire of a plurality of detection wire filaments,
the sheath covers an outer surface of a core that includes the coated electric wires and the detection wire,
the coated electric wires include
    two electric power supply wires disposed adjacent to each other, and
    the detection wire is disposed in a region enclosed by the two electric power supply wires disposed adjacent to each other and the sheath,
wherein
the coated electric wires include two communication wires, the two communication wires are twisted together to form a twisted pair communication wire, the twisted pair communication wire is disposed in a region enclosed by the two electric power supply wires disposed adjacent to each other and the sheath, and in a cross section perpendicular to a longitudinal direction of the core, the region in which the detection wire is disposed and the region in which the twisted pair communication wire is disposed are disposed so as to sandwich the two electric power supply wires disposed so as to be next to each other.

2. The multicore cable according to claim 1, wherein a filament diameter of the detection wire filaments is equal to a filament diameter of the electric wire filaments included in the electric power supply wires.

3. The multicore cable according to claim 1, wherein a filament diameter of the detection wire filaments is greater than a filament diameter of the electric wire filaments included in the electric power supply wires.

4. The multicore cable according to claim 1, wherein the detection wire is a coaxial cable including a detection wire coating covering an outer surface of the detection wire conductor, and a shield conductor covering an outer surface of the detection wire coating.

5. The multicore cable according to claim 1, wherein the electric power supply wire includes a first stranded wire formed by twisting the electric wire filaments together, and a second stranded wire formed by twisting a plurality of first stranded wires together, and a pitch of twisting of the detection wire conductor is longer than a pitch of twisting of the first stranded wire.

6. The multicore cable according to claim 1, wherein the coated electric wires include a communication wire, and a relation of $S1 > S2 \geq S3$ is satisfied, where S1 denotes a conductor cross-sectional area of the electric wire conductor included in the electric power supply wire, S2 denotes a conductor cross-sectional area of the electric wire conductor included in the communication wire, and S3 denotes a conductor cross-sectional area of the detection wire conductor.

7. The multicore cable according to claim 1, wherein the coated electric wires include two communication wires, the two communication wires are twisted together to form a twisted pair communication wire, the twisted pair communication wire is disposed in a region enclosed by: the two electric power supply wires disposed adjacent to each other and the sheath, and in a cross section perpendicular to a longitudinal direction of the core, the region in which the detection wire is disposed and the region in which the twisted pair communication wire is disposed are disposed so as to sandwich the two electric power supply wires disposed adjacent to each other.

8. The multicore cable according to claim 1, wherein the core is formed by twisting the coated electric wires and the detection wire together, and in the core, the detection wire and a first electric power supply wire of the electric power supply wires are disposed so as to contact each other and are twisted together, the first electric power supply wire being connected to a ground potential.

9. The multicore cable according to claim 1, further comprising:

a shield layer covering the outer surface of the core, wherein the shield layer is disposed between the core and the sheath.

10. The multicore cable according to claim 9, further comprising:

a drain wire, wherein the shield layer has a stacked structure of a conductive layer disposed to face the core, and a substrate including an insulating material, and the drain wire is in contact with the conductive layer.

11. The multicore cable according to claim 9, further comprising:

a drain wire, wherein the shield layer has a stacked structure of a substrate disposed to face the core and including an insulating material, and a conductive layer, and the drain wire is in contact with the substrate including the insulating material.

12. The multicore cable according to claim 1, further comprising:

a filler, wherein the filler is disposed in a region enclosed by the sheath.

13. The multicore cable according to claim 12, wherein the filler is disposed so as to contact the detection wire and the electric power supply wires.

14. A disconnection detector, comprising:

the multicore cable of claim 1; and a measurement device configured to input an inspection signal including an AC component to the detection wire conductor, and measure a characteristic impedance.

15. A multicore cable, comprising:

a plurality of coated electric wires;

a detection wire; and a sheath, wherein the coated electric wires include an electric wire conductor and an electric wire coating, the electric wire conductor being a stranded wire of a plurality of electric wire filaments, and the electric wire coating covering an outer surface of the electric wire conductor, the detection wire includes a detection wire conductor that is a stranded wire of a plurality of detection wire filaments, the sheath covers an outer surface of a core that includes the coated electric wires and the detection wire, the coated electric wires include two electric power supply wires disposed adjacent to each other, and the detection wire is disposed in a region enclosed by: the two electric power supply wires disposed adjacent to each other and the sheath, wherein the core is formed by twisting the coated electric wires and the detection wire together, and in the core, the detection wire and a first electric power supply wire of the electric power supply wires are disposed so as to contact each other and are twisted together, the first electric power supply wire being connected to a ground potential.

16. A multicore cable, comprising:

a plurality of coated electric wires;

a detection wire; and a sheath, wherein
the coated electric wires include
    an electric wire conductor and an electric wire coating,
        the electric wire conductor being a stranded wire of
        a plurality of electric wire filaments, and the electric
        wire coating covering an outer surface of the electric
        wire conductor, and
        two electric power supply wires disposed adjacent to
            each other, the detection wire includes
    a detection wire conductor that is a stranded wire of a
        plurality of detection wire filaments,
the sheath covers an outer surface of a core including the
    coated electric wires and the detection wire,
the detection wire is disposed in a region enclosed by the
    two electric power supply wires and the sheath,
the detection wire is a coaxial cable including
a detection wire coating covering an outer surface of the
    detection wire conductor, and
a shield conductor covering an outer surface of the
    detection wire coating, and
the detection wire conductor and the shield conductor are
    configured such that a characteristic impedance
    between the detection wire conductor and the shield
    conductor can be measured to detect a sign of discon-
    nection of the coated electric wires,
wherein
the two electric power supply wires are each configured to
    include:
    a first stranded wire formed by twisting the electric
        wire filaments together, and
    a second stranded wire formed by twisting a plurality of
        first stranded wires together, and
    a pitch of twisting of the detection wire conductor is
        longer than a pitch of twisting of the first stranded
        wire.

17. The multicore cable according to claim 16, wherein the characteristic impedance is measured through time domain reflectometry.

18. A multicore cable, comprising:
    a plurality of coated electric wires;
    a detection wire;
    a sheath;
    a shield layer; and
    a drain wire,
    wherein
    the coated electric wires include
        an electric wire conductor and an electric wire coating,
            the electric wire conductor being a stranded wire of
            a plurality of electric wire filaments, and
        the electric wire coating covering an outer surface of the
            electric wire conductor, the detection wire includes
            a detection wire conductor that is a stranded wire of a
                plurality of detection wire filaments,
        the sheath covers an outer surface of a core that includes
            the coated electric wires and the detection wire,
        the coated electric wires include
        two electric power supply wires disposed adjacent to each
            other, and
        the detection wire is disposed in a region enclosed by the
            two electric power supply wires and the sheath,
        the shield layer covers an outer surface of the core and is
            disposed between the core and the sheath,
        the shield layer has a stacked structure including
            a substrate including an insulating material and dis-
                posed to face the core, and
            a conductive layer,
        the drain wire is in contact with the substrate and is
            electrically connected to a ground potential, and
        the shield layer functions as an outer detection layer
            configured to detect a sign of disconnection of at least
            one of the coated electric wires.

\*    \*    \*    \*    \*